(12) United States Patent
Hori

(10) Patent No.: US 12,526,915 B2
(45) Date of Patent: Jan. 13, 2026

(54) STRETCHABLE DEVICE

(71) Applicant: Murata Manufacturing Co., Ltd., Nagaokakyo (JP)

(72) Inventor: Nobuyasu Hori, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 177 days.

(21) Appl. No.: 18/435,032

(22) Filed: Feb. 7, 2024

(65) Prior Publication Data
US 2024/0179835 A1 May 30, 2024

Related U.S. Application Data

(63) Continuation of application No. PCT/JP2022/032254, filed on Aug. 26, 2022.

(30) Foreign Application Priority Data

Nov. 19, 2021 (JP) ................... 2021-188854

(51) Int. Cl.
*H05K 1/02* (2006.01)
*H05K 1/11* (2006.01)
(Continued)

(52) U.S. Cl.
CPC ........... *H05K 1/0283* (2013.01); *H05K 1/118* (2013.01); *H05K 1/144* (2013.01); *H05K 1/145* (2013.01); *H05K 1/189* (2013.01); *H05K 1/0393* (2013.01)

(58) Field of Classification Search
CPC ...... H05K 1/0283; H05K 1/118; H05K 1/144; H05K 1/145; H05K 1/189; H05K 1/0393
(Continued)

(56) References Cited

U.S. PATENT DOCUMENTS

2018/0092206 A1 3/2018 Iwase et al.
2018/0114491 A1* 4/2018 Tokuda ............... G09G 3/3233
(Continued)

FOREIGN PATENT DOCUMENTS

JP 2008108909 A 5/2008
JP 2008306153 A 12/2008
(Continued)

OTHER PUBLICATIONS

International Search Report in PCT/JP2022/032254, mailed Nov. 15, 2022, 2 pages.

*Primary Examiner* — Andargie M Aychillhum
(74) *Attorney, Agent, or Firm* — ArentFox Schiff LLP

(57) ABSTRACT

A stretchable device that includes: a stretchable first substrate having a first main surface and a second main surface facing each other and extending in a first direction; a stretchable first wiring on the first main surface and extending along the first main surface; a second substrate that has a third main surface and a fourth main surface facing each other; and a second wiring on the third main surface and extending along the third main surface. The first substrate includes a connection region overlapping the second substrate and a non-connection region not overlapping the second substrate when viewed from a direction orthogonal to the first main surface, the stretchable first substrate and the second substrate are connected in the connection region, and the stretchable first substrate has a first hole portion in at least one of the first main surface and the second main surface in the non-connection region.

19 Claims, 10 Drawing Sheets

(51) Int. Cl.
*H05K 1/14*   (2006.01)
*H05K 1/18*   (2006.01)
*H05K 1/03*   (2006.01)

(58) Field of Classification Search
USPC .......................................................... 174/254
See application file for complete search history.

(56) References Cited

U.S. PATENT DOCUMENTS

2019/0386053 A1* 12/2019 Amano ................. H10F 39/809
2022/0015227 A1   1/2022 Ogawa et al.

FOREIGN PATENT DOCUMENTS

| | | |
|---|---|---|
| JP | 2012033597 A | 2/2012 |
| JP | 2013145842 A | 7/2013 |
| JP | 2018056321 A | 4/2018 |
| JP | 2019075420 A | 5/2019 |
| JP | 2020-088337 A | 6/2020 |
| JP | 2021057506 A | 4/2021 |
| WO | 2020091012 A1 | 5/2020 |
| WO | 2020262288 A1 | 12/2020 |

* cited by examiner

STRETCHABLE DEVICE

CROSS REFERENCE TO RELATED APPLICATIONS

The present application is a continuation of International application No. PCT/JP2022/032254, filed Aug. 26, 2022, which claims priority to Japanese Patent Application No. 2021-188854, filed Nov. 19, 2021, the entire contents of each of which are incorporated herein by reference.

TECHNICAL FIELD

The present disclosure relates to a stretchable device.

BACKGROUND ART

Conventionally, as a stretchable device, there is one described in Japanese Patent Application Laid-Open No. 2013-145842 (Patent Document 1). The stretchable device includes a stretchable circuit body in which a stretchable wiring portion is provided in a stretchable insulating base material, a non-stretchable component mounting substrate stacked in a predetermined region of the stretchable circuit body, and an electrical connection portion electrically connecting a wiring portion of the component mounting substrate and a wiring portion of the stretchable circuit body. The component mounting substrate is provided with an expansion and contraction prevention guard that prevents expansion and contraction of a region including the electrical connection portion of the stretchable circuit body.

SUMMARY OF THE INVENTION

It has been found that, in the conventional stretchable device, when the stretchable circuit body is expanded and used, a wiring portion of the stretchable circuit body near the expansion and contraction prevention guard may be disconnected. That is, since a part of the wiring portion is prevented from expanding and contracting by the expansion and contraction prevention guard, when the stretchable circuit body is expanded, a tensile force for pulling to opposite sides is generated between an expanding and contracting portion and a non-expanding and contracting portion of the wiring portion, and possibly generates a starting point of disconnection of the wiring portion. As described above, the wiring portion may be disconnected as the stretchable device expands.

In view of the above, an object of the present disclosure is to provide a stretchable device capable of preventing disconnection of a wiring due to expansion of the stretchable device.

In order to solve the above problem, a stretchable device according to an aspect of the present disclosure includes: a stretchable first substrate that has a first main surface and a second main surface facing each other, the stretchable first substrate extending in a first direction; a stretchable first wiring on the first main surface and extending along the first main surface; a second substrate that has a third main surface and a fourth main surface facing each other; and a second wiring on the third main surface and extending along the third main surface, wherein the stretchable first substrate includes a connection region overlapping the second substrate and a non-connection region not overlapping the second substrate when viewed from a direction orthogonal to the first main surface, the stretchable first substrate and the second substrate are connected in the connection region, and the stretchable first substrate has a first hole portion in at least one of the first main surface and the second main surface in the non-connection region.

The stretchable device may also include a connection member that connects the stretchable first substrate and the second substrate in the connection region, where the connection member overlaps the connection region when viewed from the direction orthogonal to the first main surface.

Here, "on the main surface" refers to not an absolute direction such as vertically upward defined in the direction of gravity but a direction toward the outside between the outside and the inside of the substrate having the main surface as a boundary. Therefore, "on the main surface" is a relative direction determined by a direction of the main surface. Further, "on" a certain element includes not only a position immediately above and in contact with the element (on) but also an upper position away from the element, that is, an upper position with another object on the element interposed between them or an upper position with a space between them (above).

Further, extending in the first direction refers to extending along one path instead of extending in a manner branched into a plurality of paths, and includes not only extending linearly but also extending in a curved, meandering, or spiral shape. The first direction is not limited to a longitudinal direction of the first substrate, and refers to a stretching direction of the first substrate.

Further, the hole portion may be one that has a bottom that does not penetrate the first substrate (the first main surface and the second main surface), or may be one that penetrates the first substrate (the first main surface and the second main surface). The hole portion includes not only a circle, an ellipse, and a polygon but also a slit shape when viewed from a direction orthogonal to the first main surface. The hole portion is not limited to a closed hole in which an inner surface of a hole is continuous in a circumferential direction when viewed from a direction orthogonal to the first main surface, and includes, for example, an open hole notched from a peripheral edge of the first substrate and in which an inner surface of the hole opens to a peripheral edge.

According to the above aspect, since the first substrate has the first hole portion in the non-connection region, when the first substrate is expanded in the first direction, the vicinity of the first hole portion of the first substrate is easily expanded, and expansion in the vicinity of the connection region of the first substrate can be reduced. By the above, it is possible to prevent disconnection of the first wiring in the vicinity of the non-connection region and to prevent disconnection of the first wiring due to expansion of the first substrate of the stretchable device.

Preferably, in an embodiment of the stretchable device, the first hole portion penetrates the first substrate.

According to the above embodiment, the vicinity of the first hole portion of the first substrate is more easily expanded, expansion in the vicinity of the connection region of the first substrate is further reduced, and disconnection of the first wiring due to expansion of the first substrate can be further prevented.

Preferably, in an embodiment of the stretchable device, a shortest distance in the first direction between the first hole portion and the connection region is larger than a maximum diameter in the first direction of the first hole portion.

According to the above embodiment, it is possible to separate the first hole portion from the connection region, to further reduce expansion in the vicinity of the connection region of the first substrate, and to further prevent disconnection of the first wiring due to expansion of the first substrate.

Preferably, in an embodiment of the stretchable device, a part of the first substrate is present between the first wiring and the first hole portion in a second direction orthogonal to the first direction.

According to the above embodiment, it is possible to separate the first hole portion from the first wiring and to prevent exposure of the first wiring from the first hole portion. By the above, it is possible to reduce a risk that the first hole portion is displaced and comes into contact with the first wiring, and it is possible to reduce damage to the first wiring from the outside via the first hole portion.

Preferably, an embodiment of the stretchable device further includes a second hole portion arranged in the first direction with respect to the first hole portion, and the first hole portion is closer to the connection region than the second hole portion, and a shortest distance between the connection region and the first hole portion is larger than a shortest distance between the first hole portion and the second hole portion in the first direction.

According to the above embodiment, expansion in the vicinity of the first hole portion and the second hole portion of the first substrate is further improved, and expansion in the vicinity of the connection region of the first substrate is further reduced, and by the above, disconnection of the first wiring due to expansion of the first substrate can be further prevented.

Further, the first hole portion can be separated from the connection region, and expansion in the vicinity of the connection region of the first substrate can be further reduced. Further, the first hole portion and the second hole portion can be brought close to each other, expansion in the vicinity of the first hole portion and the second hole portion of the first substrate can be further improved, and expansion in the vicinity of the connection region of the first substrate can be further reduced.

Preferably, an embodiment of the stretchable device further includes a third hole portion arranged in the first direction with respect to the first hole portion and the second hole portion, and the second hole portion is closer to the connection region than the third hole portion, and a shortest distance between the first hole portion and the second hole portion is larger than a shortest distance between the second hole portion and the third hole portion in the first direction.

According to the above embodiment, the second hole portion can be separated from the connection region, and expansion in the vicinity of the connection region of the first substrate can be further reduced. Further, the second hole portion and the third hole portion can be brought close to each other, expansion in the vicinity of the second hole portion and the third hole portion of the first substrate can be further improved, and expansion in the vicinity of the connection region of the first substrate can be further reduced.

Preferably, an embodiment of the stretchable device further includes a fourth hole portion, and the first wiring is arranged between the first hole portion and the fourth hole portion.

According to the above embodiment, expansion in the vicinity of the first hole portion and the fourth hole portion of the first substrate is further improved, and expansion in the vicinity of the connection region of the first substrate is further reduced, and by the above, disconnection of the first wiring due to expansion of the first substrate can be further prevented.

Preferably, an embodiment of the stretchable device further includes a fifth hole portion arranged in the first direction with respect to the fourth hole portion, and the fourth hole portion is closer to the connection region than the fifth hole portion in the first direction.

According to the above embodiment, expansion in the vicinity of the fourth hole portion and the fifth hole portion of the first substrate is further improved, and expansion in the vicinity of the connection region of the first substrate is further reduced, and by the above, disconnection of the first wiring due to expansion of the first substrate can be further prevented.

Preferably, a second hole portion arranged in the first direction with respect to the first hole portion is further included, the first hole portion is closer to the connection region than the second hole portion in the first direction, a shortest distance between the first hole portion and the connection region is different from a shortest distance between the fourth hole portion and the connection region in the first direction, and a shortest distance between the second hole portion and the connection region is different from a shortest distance between the fifth hole portion and the connection region in the first direction.

According to the above embodiment, it is possible to further reduce a load on the first wiring due to expansion in the vicinity of the hole portion of the first substrate.

Preferably, the second hole portion and the fifth hole portion are arranged in a zigzag manner.

Here, "the second hole portion and the fifth hole portion are arranged in a zigzag manner" means that the center of the second hole portion and the center of the fifth hole portion do not overlap each other in the second direction orthogonal to the first direction, and the entire second hole portion and the entire fifth hole portion preferably do not overlap each other.

According to the above embodiment, it is possible to further reduce a load on the first wiring due to expansion in the vicinity of the hole portion of the first substrate.

Preferably, an embodiment of the stretchable device further includes a second hole portion arranged in the first direction with respect to the first hole portion, and the first hole portion is closer to the connection region than the second hole portion in the first direction, a shortest distance between the first hole portion and the connection region is equal to a shortest distance between the fourth hole portion and the connection region in the first direction, and a shortest distance between the second hole portion and the connection region is different from a shortest distance between the fifth hole portion and the connection region in the first direction.

According to the above embodiment, it is possible to further reduce a load on the first wiring due to expansion in the vicinity of the hole portion of the first substrate.

Preferably, the second hole portion and the fifth hole portion are arranged in a zigzag manner.

Here, "the second hole portion and the fifth hole portion are arranged in a zigzag manner" means that the center of the second hole portion and the center of the fifth hole portion do not overlap each other in the second direction orthogonal to the first direction, and the entire second hole portion and the entire fifth hole portion preferably do not overlap each other.

According to the above embodiment, it is possible to further reduce a load on the first wiring due to expansion in the vicinity of the hole portion of the first substrate.

Preferably, an embodiment of the stretchable device further includes a protective film that covers at least a part of the first main surface of the first substrate and at least a part of the first wiring.

According to the above embodiment, since the protective film covers at least a part of the first wiring, insulation from a disturbance factor can be secured, and in a case of use on a living body, discomfort of the user can be reduced. Further, since the protective film covers at least a part of the first main surface of the first substrate, in a case of use on a living body, discomfort of the user can be reduced. Note that the present embodiment can also be used for an object other than a living body. Further, a biocompatible one may be used for the protective film, and in that case, discomfort of the user can be reduced. Note that the protective film does not need to have biocompatibility.

Preferably, in an embodiment of the stretchable device, the protective film has a through hole overlapping the hole portion when viewed from a direction orthogonal to the first main surface.

According to the above embodiment, when the protective film is provided, expansion in the vicinity of the hole portion of the first substrate can be improved, and expansion in the vicinity of the connection region of the first substrate can be reduced.

Preferably, in an embodiment of the stretchable device, the protective film has an overlapping portion overlapping the hole portion as viewed from a direction orthogonal to the first main surface, and the overlapping portion is located outside the hole portion.

According to the above embodiment, an internal space of the hole portion can be secured, expansion in the vicinity of the hole portion of the first substrate can be improved, and expansion in the vicinity of the connection region of the first substrate can be reduced.

According to the stretchable device according to an aspect of the present disclosure, it is possible to prevent disconnection of the wiring due to expansion of the stretchable device.

DETAILED DESCRIPTION OF THE INVENTION

Hereinafter, a stretchable device according to an aspect of the present disclosure will be described in detail with reference to an illustrated embodiment. Note that the drawings include some schematic drawings, and may not reflect an actual dimension or a ratio.

First Embodiment

Figure 1:
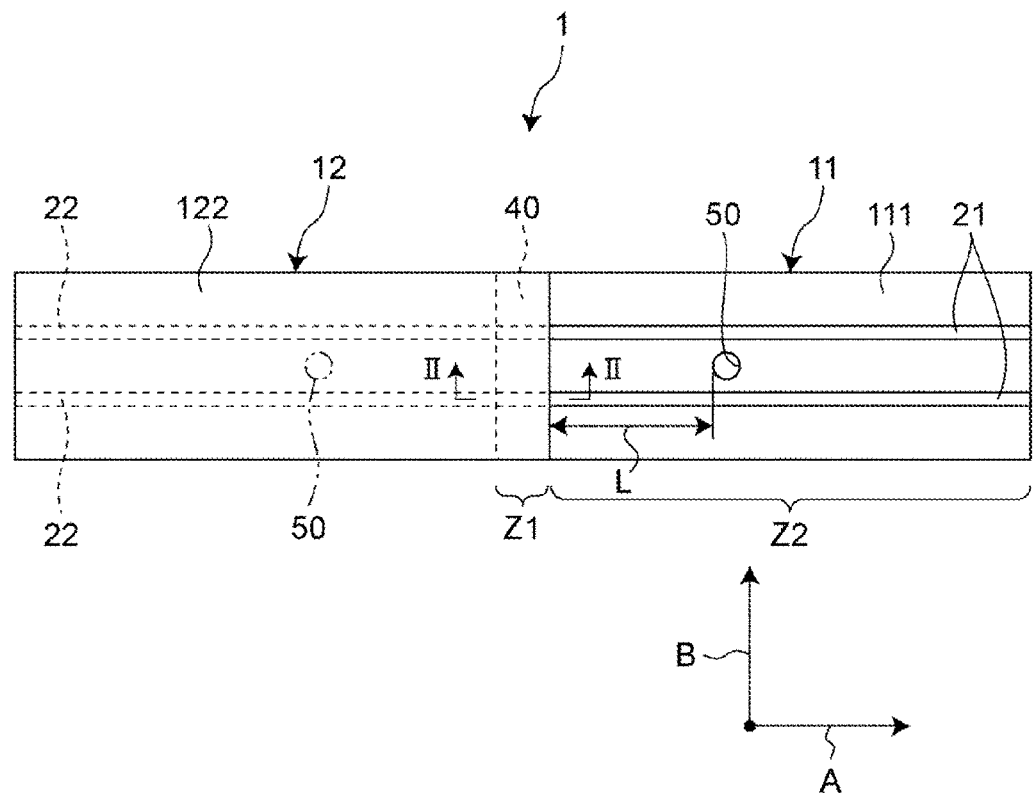
FIG. 1 is a plan view illustrating a first embodiment of a stretchable device.
Figure 2:
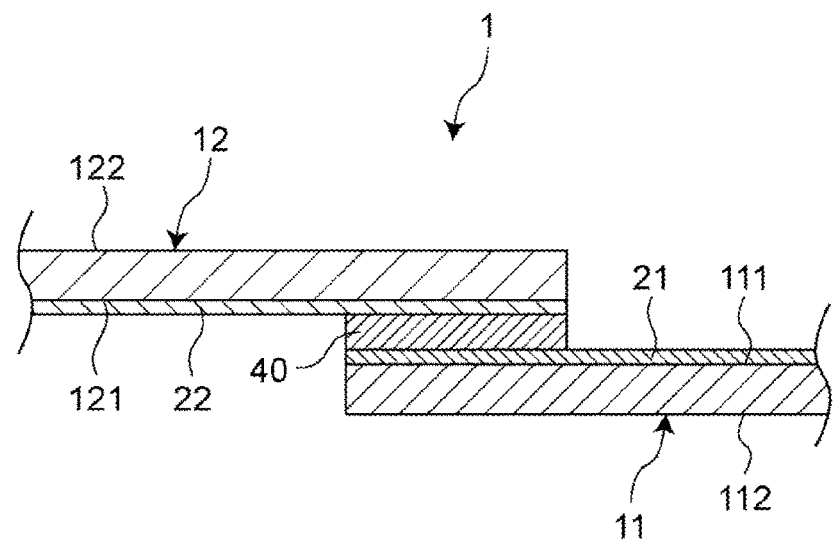
FIG. 2 is a sectional view taken along II-II of FIG. 1.

FIG. 1 is a plan view illustrating a first embodiment of the stretchable device. FIG. 2 is a sectional view taken along II-II of FIG. 1. The stretchable device is attached to a living body and used to measure a biological signal.

As illustrated in FIGS. 1 and 2, a stretchable device 1 includes a stretchable first substrate 11, a stretchable first wiring 21 provided on the first substrate 11, a second substrate 12, a second wiring 22 provided on the second substrate 12, and a connection member 40 that connects the first substrate 11 and the second substrate 12 and connects the first wiring 21 and the second wiring 22.

The first substrate 11 has a first main surface 111 and a second main surface 112 facing each other. The first substrate 11 extends in a first direction A. The first substrate 11 is formed in a rectangular shape having a long side along the first direction A. A width of the first substrate 11 is constant along the first direction A. The width refers to a length in a second direction B orthogonal to the first direction A.

The first substrate 11 is formed of a stretchable resin material, for example, styrene resin, olefin resin, epoxy resin, urethane resin, acrylic resin, or silicone resin, and is preferably formed of urethane resin. Examples of the urethane resin include thermoplastic polyurethane (TPU). Examples of the styrene resin include styrene-butadiene-styrene copolymer resin (SBS).

A stretching ratio of the first substrate 11 is preferably 50% or more. By setting the above stretching ratio, followability of the stretchable device to a living body becomes excellent. Young's modulus of the first substrate 11 is preferably 100 MPa or less, and more preferably 30 MPa or less. By setting the above Young's modulus, discomfort of the user can be reduced. A thickness of the first substrate 11 is, for example, 0.1 μm to 100 μm. A width of the first substrate 11 is, for example, 10 mm to 100 mm.

The first wiring 21 is provided on the first main surface 111 and extends along the first main surface 111. The first wiring 21 extends along the first direction A. There are a plurality of the first wirings 21, and a plurality of the first wirings 21 are arranged side by side in the second direction B. In the first embodiment, there are two of the first wirings 21.

The first wiring 21 is formed of a conductive material having elasticity. For the conductive material, for example, a mixture of metal powder of silver, copper, nickel or the like and elastomeric resin such as silicone is used. An average particle D50 of the metal powder is preferably 0.01 μm to 10 μm. A shape of the metal powder may be a spherical shape, a flat shape, an irregular shape having a protrusion, or the like.

A thickness of the first wiring 21 is preferably 100 μm or less, more preferably 50 μm or less, and preferably 1 μm or more, more preferably 10 μm or more. The thinner the thickness of the first wiring 21, the less the unevenness and the easier the lamination and the like. A width of the first wiring 21 is preferably 0.1 mm to 4 mm.

The first wiring 21 is formed by screen printing, inkjet printing, dispensing, or etching of metal foil so as to be in direct contact with the first main surface 111. Note that the first wiring 21 may be arranged on the first main surface 111 with an insulating film (not illustrated) having insulating property interposed between them. Further, the first wiring 21 may be covered with an insulating film.

The second substrate 12 has a third main surface 121 and a fourth main surface 122 facing each other. The second substrate 12 extends in the first direction A. The second substrate 12 is formed in a rectangular shape having a long side along the first direction A. A width of the second substrate 12 is constant along the first direction A. The width refers to a length in the second direction B.

The second substrate 12 is formed of a resin material, for example, styrene resin, olefin resin, epoxy resin, urethane resin, acrylic resin, or silicone resin. The second substrate 12 may be, for example, a flexible substrate (FPC) or a printed circuit board (PCB). The second substrate 12 may be stretchable. When the second substrate 12 is stretchable, a stretching load applied to the second substrate 12 can be reduced.

A stretching ratio of the second substrate 12 is preferably 50% or more. By setting the above stretching ratio, followability of the stretchable device to a living body becomes excellent. Young's modulus of the second substrate 12 is preferably 100 MPa or less, and more preferably 30 MPa or less. By setting the above Young's modulus, discomfort of the user can be reduced. A thickness of the second substrate 12 is, for example, 0.1 μm to 100 μm. A width of the second substrate 12 is, for example, 10 mm to 100 mm.

The second wiring 22 is provided on the third main surface 121 and extends along the third main surface 121. The second wiring 22 extends along the first direction A. There are a plurality of the second wirings 22, and a plurality of the second wirings 22 are arranged side by side in the second direction B. In the first embodiment, there are two of the second wirings 22.

The second wiring 22 is formed of a conductive material. As the conductive material, for example, metal foil of silver, copper, nickel or the like may be used, or a mixture of metal powder of silver, copper, nickel or the like and elastomeric resin such as epoxy resin, urethane resin, acrylic resin, or silicone resin may be used. A thickness of the metal foil is preferably 0.01 μm to 10 μm, and an average particle D50 of the metal powder is preferably 0.01 μm to 10 μm. A shape of the metal powder may be a spherical shape, a flat shape, an irregular shape having a protrusion, or the like. The second wiring 22 may be stretchable.

A thickness of the second wiring 22 is preferably 100 μm or less, more preferably 50 μm or less, and preferably 1 μm or more, more preferably 10 μm or more. The thinner the thickness of the second wiring 22, the less the unevenness and the easier the lamination and the like. A width of the second wiring 22 is preferably 0.1 mm to 4 mm.

The second wiring 22 is formed by screen printing, inkjet printing, dispensing, or etching of metal foil so as to be in direct contact with the third main surface 121. Note that the second wiring 22 may be arranged on the third main surface 121 with an insulating film (not illustrated) having insulating property interposed between them, and the second wiring 22 may be covered with an insulating film.

The first substrate 11 and the second substrate 12 are arranged such that end portions in the first direction A of the substrates overlap each other. Specifically, the first substrate 11 and the second substrate 12 are arranged such that first main surface 111 and third main surface 121 face each other. The first wiring 21 and the second wiring 22 are arranged to face each other.

The connection member 40 is arranged between the first substrate 11 and the second substrate 12 in a portion where the first substrate 11 and the second substrate 12 overlap each other, and connects the first substrate 11 and the second substrate 12. Further, the connection member 40 is arranged between the first wiring 21 and the second wiring 22 in a portion where the first substrate 11 and the second substrate 12 overlap each other, and connects the first wiring 21 and the second wiring 22. The connection member 40 has adhesiveness and conductivity. Since the connection member 40 has conductivity, the first wiring 21 and the second wiring 22 are electrically connected via the connection member 40.

Note that a method of connecting the first substrate 11 and the second substrate 12 is not limited to the method described above, and for example, the first substrate 11 and the second substrate 12 may be arranged such that the first main surface 111 and the third main surface 121 face the same direction, and the first substrate 11 and the second substrate 12 may be connected by the connection member 40.

The connection member 40 is, for example, an anisotropic conductive film (ACF), has conductivity with respect to a direction orthogonal to the first main surface 111, and has insulation with respect to a planar direction parallel to the first main surface 111. The connection member 40 includes thermosetting epoxy resin and conductive particles arranged in a manner dispersed in the epoxy resin. Therefore, the first wiring 21 is conductive only to the second wiring 22 immediately above, and is not conductive to the first wiring 21 adjacent in a direction of the first main surface 111 or the second wiring 22 not immediately above.

A thickness of the connection member 40 is, for example, preferably 1 μm to 100 μm, and more preferably 5 μm to 50 μm. A width of the connection member 40 is preferably large enough to cover the first wiring 21 and the second wiring 22 to be connected, but for example, preferably matches the larger one of a width of the first substrate 11 and a width of the second substrate 12.

The first substrate 11 includes a connection region Z1 overlapping the second substrate 12 and a non-connection region Z2 not overlapping the second substrate 12 when viewed from a direction orthogonal to the first main surface 111. The connection member 40 overlaps the connection region Z1 when viewed from a direction orthogonal to the first main surface 111. The first substrate 11 and the second substrate 12 are connected in the connection region Z1. The first substrate 11 has a hole portion 50 provided on the first main surface 111 in the non-connection region Z2. The hole portion 50 corresponds to an example of a "first hole portion" described in the claims.

The hole portion 50 penetrates the first main surface 111 and the second main surface 112. The hole portion 50 is formed in a circular shape when viewed from a direction orthogonal to the first main surface 111. A diameter of the hole portion 50 is, for example, 0.4 mm. The hole portion 50 is located at the center in a width direction of the first substrate 11 and is located between two of the first wirings 21.

According to the above configuration, since the first substrate 11 has the hole portion 50 in the non-connection region Z2, when the first substrate 11 expands in the first direction A, the vicinity of the hole portion 50 of the first substrate 11 is easily expanded, and expansion of the vicinity of the connection region Z1 of the first substrate 11 can be reduced. The vicinity of the connection region Z1 of the first substrate 11 refers to a range within 300 μm from the connection region Z1. That is, expansion in the first direction A of the first substrate 11 can be absorbed in the vicinity of the hole portion 50 of the first substrate 11. In other words, Young's modulus of the non-connection region 22 is smaller than Young's modulus of the connection region Z1. By the above, it is possible to prevent disconnection of the first wiring 21 in the vicinity of the non-connection region Z2 and to prevent disconnection of the first wiring 21 due to expansion of the first substrate 11 of the stretchable device 1.

Note that the hole portion 50 may be provided in the first main surface 111 and may have a bottom that does not penetrate the second main surface 112, and the above effect is obtained in this case as well. Alternatively, the hole portion 50 may be provided in the second main surface 112 and have a bottom that does not penetrate the first main surface 111, and the above effect is obtained in this case as well. As in this embodiment, the hole portion 50 penetrates the first substrate 11, so that a more remarkable effect is obtained.

Note that the second substrate 12 and the second wiring 22 may be stretchable. At this time, similarly to the first substrate 11, the second substrate 12 may also include a connection region overlapping the connection member 40 and a non-connection region not overlapping the connection member 40, and the second substrate 12 may have the hole portion 50 on at least one of the third main surface 121 and the fourth main surface 122 in the non-connection region as indicated by a two-dot chain line in FIG. 1. By the above, disconnection of the second wiring 22 in the vicinity of the non-connection region can be prevented, and disconnection of the second wiring 22 due to expansion of the second substrate 12 of the stretchable device 1 can be prevented. Preferably, the hole portion 50 penetrates the second substrate 12, so that a more remarkable effect is obtained.

Further, a shape of the hole portion 50 may be an elliptical shape, a polygonal shape, or a slit shape. At this time, the hole portion 50 preferably has a shape elongated in the first direction A, and expansion in the vicinity of the hole portion 50 can be improved.

Note that the connection member 40 may be present between the first substrate 11 and the second substrate 12 without being present between the first wiring 21 and the second wiring 22. Further, the connection member 40 does not need to be provided, and the first substrate 11 and the second substrate 12 may be directly connected by welding or the like. Also in this case, the connection region Z1 of the first substrate 11 is a region that overlaps the second substrate 12 and is connected to the second substrate 12 when viewed from a direction orthogonal to the first main surface 111, and the non-connection region Z2 of the first substrate 11 is a region that does not overlap the second substrate 12 and is not connected to the second substrate 12 when viewed from a direction orthogonal to the first main surface 111.

Preferably, in the first substrate 11, a shortest distance L in the first direction A between the hole portion 50 and the connection region Z1 is larger than a maximum diameter in the first direction A of the hole portion 50. The shortest distance L is, for example, 0.5 mm to 10 mm, preferably 0.8 mm to 7 mm, more preferably 1 mm to 6.5 mm, and still more preferably 1.3 mm to 6 mm.

According to the above configuration, the hole portion 50 can be separated from the connection region Z1, expansion in the vicinity of the connection region Z1 of the first substrate 11 can be further reduced, and disconnection of the first wiring 21 due to expansion of the first substrate 11 can be further prevented. Note that, in a case where a hole portion is provided in the second substrate 12, it is preferable to have the same configuration as that of the first substrate 11.

Preferably, in the second direction B, a part of the first substrate 11 is present between the first wiring 21 and the hole portion 50. A shortest distance between two of the first wirings 21 is, for example, 0.5 mm, preferably 100 μm larger than a diameter of the hole portion 50, more preferably 200 μm larger than a diameter of the hole portion 50, and still more preferably 300 μm larger than a diameter of the hole portion 50. By the above, a part of the first substrate 11 can be interposed between the first wiring 21 and the hole portion 50.

According to the above configuration, the hole portion 50 can be separated from the first wiring 21, and the first wiring 21 can be prevented from being exposed from the hole portion 50. By the above, it is possible to reduce a risk that the hole portion 50 is displaced and comes into contact with the first wiring 21, and it is also possible to reduce damage to the first wiring 21 from the outside via the hole portion 50. Note that, in a case where a hole portion is provided in the second substrate 12, it is preferable to have the same configuration as that of the first substrate 11.

Second Embodiment

Figure 3:
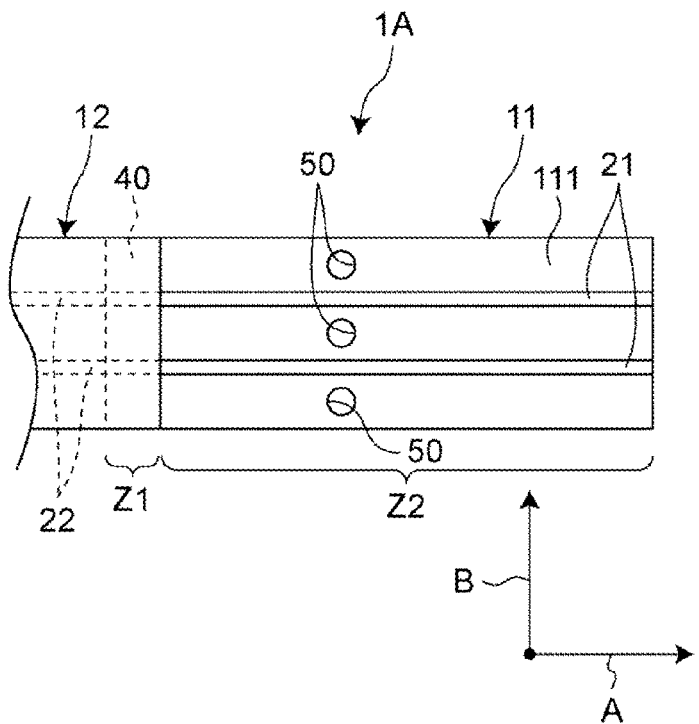
FIG. 3 is a plan view illustrating a second embodiment of the stretchable device.

FIG. 3 is a plan view illustrating a second embodiment of the stretchable device. The second embodiment is different from the first embodiment in the configuration of the hole portion. This different configuration will be described below. The other configurations are the same as those of the first embodiment, and are denoted by the same reference symbols as those of the first embodiment, and will be omitted from description.

As illustrated in FIG. 3, in a stretchable device 1A of the second embodiment, the first substrate 11 has a plurality of the hole portions 50, and the hole portions 50 are located on both sides in the second direction B of the first wiring 21. In the second embodiment, since there are two of the first wirings 21, there are three of the hole portions 50. A plurality of the hole portions 50 are linearly arranged in the second direction B.

The hole portion 50 located on one side in the second direction B of the first wiring 21 corresponds to an example of a "first hole portion" described in the claims, and the hole portion 50 located on the other side in the second direction B of the first wiring 21 corresponds to an example of a "fourth hole portion" described in the claims.

According to the above configuration, expansion in the vicinity of a plurality of the hole portions 50 of the first substrate 11 is further improved, and expansion in the vicinity of the connection region Z1 of the first substrate 11 is further reduced, so that disconnection of the first wiring 21 due to expansion of the first substrate 11 can be further prevented.

Note that, in a case where a hole portion is provided in the second substrate 12, it is preferable to have the same configuration as that of the first substrate 11.

Third Embodiment

Figure 4:
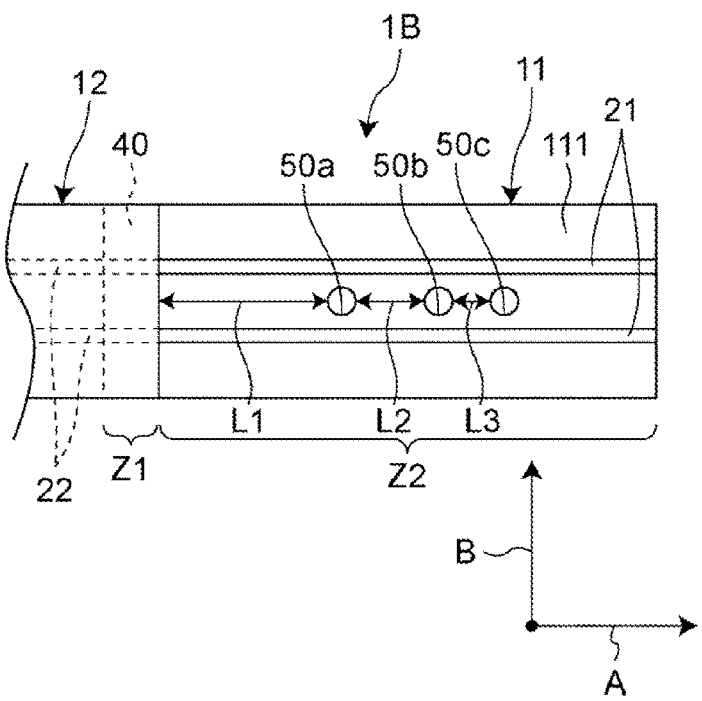
FIG. 4 is a plan view illustrating a third embodiment of the stretchable device.

FIG. 4 is a plan view illustrating a third embodiment of the stretchable device. The third embodiment is different from the first embodiment in the configuration of the hole portion. This different configuration will be described below. The other configurations are the same as those of the first embodiment, and are denoted by the same reference symbols as those of the first embodiment, and will be omitted from description.

As illustrated in FIG. 4, in a stretchable device 1B of the third embodiment, the first substrate 11 has a plurality of hole portions 50a, 50b, and 50c, and a plurality of the hole portions 50a, 50b, and 50c are arranged along the first direction A. In the third embodiment, there are three of the hole portions 50a, 50b, and 50c. A plurality of the hole portions 50a, 50b, and 50c are located between two of the first wirings 21 and arranged linearly along the first direction A.

According to the above configuration, expansion in the vicinity of a plurality of the hole portions 50a, 50b, and 50c of the first substrate 11 is further improved, and expansion in the vicinity of the connection region Z1 of the first substrate 11 is further reduced, so that disconnection of the first wiring 21 due to expansion of the first substrate 11 can be further prevented. Further, stress generated when the first substrate 11 expands in the first direction A can be dispersed to the vicinity of each of a plurality of the hole portions 50a, 50b, and 50c, and durability of the first substrate 11 and the first wiring 21 can be improved.

As illustrated in FIG. 4, a plurality of the hole portions 50a, 50b, and 50c include the first hole portion 50a closest to the connection region Z1, the second hole portion 50b second closest to the connection region Z1, and the third hole portion 50c third closest to the connection region Z1. That is, the second hole portion 50b is arranged in the first direction A with respect to the first hole portion 50a, and the first hole portion 50a is closer to the connection member 40 (connection region Z1) than the second hole portion 50b. The third hole portion 50c is arranged in the first direction A with respect to the second hole portion 50b, and the second hole portion 50b is closer to the connection member 40 (connection region Z1) than the third hole portion 50c. The first hole portion 50a corresponds to an example of a "first hole portion" described in the claims, the second hole portion 50b corresponds to an example of a "second hole portion" described in the claims, and the third hole portion 50c corresponds to an example of a "third hole portion" described in the claims.

Preferably, a first shortest distance L1 in the first direction A between the first hole portion 50a and the connection region Z1 is larger than a second shortest distance L2 in the first direction A between the first hole portion 50a and the second hole portion 50b.

According to the above configuration, the first hole portion 50a can be separated from the connection region Z1, and expansion in the vicinity of the connection region Z1 of the first substrate 11 can be further reduced. Further, the first hole portion 50a and the second hole portion 50b can be brought close to each other, and expansion in the vicinity of the first and second hole portions 50a and 50b of the first substrate 11 can be further improved, and expansion in the vicinity of the connection region Z1 of the first substrate 11 can be further reduced.

Preferably, the second shortest distance L2 is larger than a third shortest distance L3 in the first direction A between the second hole portion 50b and the third hole portion 50c.

According to the above configuration, the second hole portion 50b can be separated from the connection region Z1, and expansion in the vicinity of the connection region Z1 of the first substrate 11 can be further reduced. Further, the second hole portion 50b and the third hole portion 50c can be brought close to each other, expansion in the vicinity of the second and third hole portions 50b and 50c of the first substrate 11 can be further increased, and expansion in the vicinity of the connection region Z1 of the first substrate 11 can be further reduced.

Note that, four or more hole portions may be aligned along the first direction A, and in this case, an interval between the fourth and subsequent adjacent hole portions is preferably the third shortest distance L3.

Note that, in a case where a hole portion is provided in the second substrate 12, it is preferable to have the same configuration as that of the first substrate 11.

Fourth Embodiment

Figure 5:
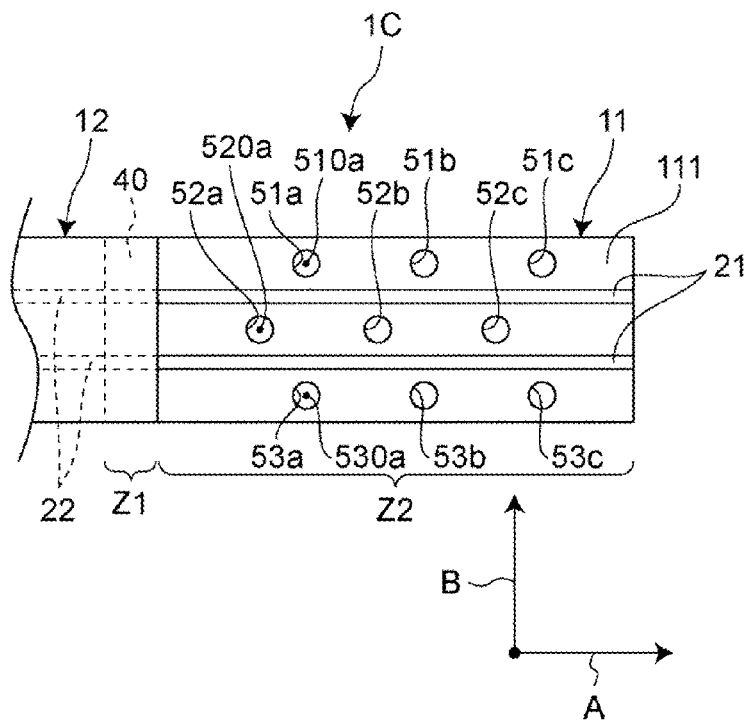
FIG. 5 is a plan view illustrating a fourth embodiment of the stretchable device.

FIG. 5 is a plan view illustrating a fourth embodiment of the stretchable device. The fourth embodiment is different from the first embodiment in the configuration of the hole portion. This different configuration will be described below. The other configurations are the same as those of the first embodiment, and are denoted by the same reference symbols as those of the first embodiment, and will be omitted from description.

As illustrated in FIG. 5, in a stretchable device 1C of the fourth embodiment, the first substrate 11 has a plurality of hole portions 51a to 51c, 52a to 52c, and 53a to 53c. Specifically, a plurality of the hole portions 51a to 51c, 52a to 52c, and 53a to 53c include the hole portions 51a to 51c of the first group arranged linearly along the first direction A, the hole portions 52a to 52c of the second group arranged linearly along the first direction A, and the hole portions 53a to 53c of the third group arranged linearly along the first direction A. The hole portions 51a to 51c of the first group, the hole portions 52a to 52c of the second group, and the hole portions 53a to 53c of the third group are arranged in parallel along the second direction B.

The hole portions 51a to 51c of the first group include the first hole portion 51a closest to the connection region Z1, the second hole portion 51b second closest to the connection region Z1, and the third hole portion 51c third closest to the connection region Z1. That is, the second hole portion 51b is arranged in the first direction A with respect to the first hole portion 51a, and the first hole portion 51a is closer to the connection member 40 (connection region Z1) than the second hole portion 51b. The third hole portion 51c is arranged in the first direction A with respect to the second hole portion 51b, and the second hole portion 51b is closer to the connection member 40 (connection region Z1) than the third hole portion 51c.

Similarly, the hole portions 52a to 52c of the second group include the first hole portion 52a closest to the connection region Z1, a second hole portion 52b second closest to the connection region Z1, and a third hole portion 52c third closest to the connection region Z1. The hole portions 53a to 53c of the third group include the first hole portion 53a closest to the connection region Z1, the second hole portion 53b second closest to the connection region Z1, and the third hole portion 53c third closest to the connection region Z1.

First, regarding the first wiring 21 on the upper side in FIG. 5, the hole portions 51a to 51c of the first group are located on one side (upper side) in the second direction B with respect to the first wiring 21 on the upper side, and the hole portions 52a to 52c of the second group are located on the other side (lower side) in the second direction B with respect to the first wiring 21 on the upper side.

At this time, in the hole portions 51a to 51c of the first group, the first hole portion 51a corresponds to an example of a "first hole portion" described in the claims, the second hole portion 51b corresponds to an example of a "second hole portion" described in the claims, and the third hole portion 51c corresponds to an example of a "third hole portion" described in the claims. Further, in the hole portions 52a to 52c of the second group, the first hole portion 52a corresponds to an example of a "fourth hole portion" described in the claims, and the second hole portion 52b corresponds to an example of a "fifth hole portion" described in the claims.

The hole portions 51a to 51c of the first group and the hole portions 52a to 52c of the second group are alternately arranged along the first direction A. At this time, a center 510a of the first hole portion 51a of the first group and a center 520a of the first hole portion 52a of the second group do not overlap in the second direction B. Further, the center of the second hole portion 51b of the first group and the center of the second hole portion 52b of the second group do not overlap in the second direction B. Further, the center of the third hole portion 51c of the first group and the center of the third hole portion 52c of the second group do not overlap in the second direction B. In other words, the hole portions 51a to 51c of the first group and the hole portions 52a to 52c of the second group are arranged in a zigzag manner with respect to the first wiring 21.

Further, in the first direction A, a shortest distance between the first hole portion 51a in the first group and the connection member 40 (connection region Z1) is different from a shortest distance between the first hole portion 52a in the second group and the connection member 40 (connection region Z1). Further, in the first direction A, a shortest distance between the second hole portion 51b of the first group and the connection member 40 (connection region Z1) is different from a shortest distance between the second hole portion 52b of the second group and the connection member 40 (connection region Z1). Further, in the first direction A, a shortest distance between the third hole portion 51c of the first group and the connection member 40 (connection region Z1) is different from a shortest distance between the third hole portion 52c of the second group and the connection member 40 (connection region Z1).

According to the above configuration, since the hole portions 51a to 51c of the first group and the hole portions 52a to 52c of the second group are included, expansion in the vicinity of a plurality of the hole portions 51a to 51c and 52a to 52c of the first substrate 11 is further improved, and expansion in the vicinity of the connection region Z1 of the first substrate 11 is further reduced, so that disconnection of the first wiring 21 due to expansion of the first substrate 11 can be further prevented. Further, since the hole portions 51a to 51c of the first group and the hole portions 52a to 52c of the second group are arranged in a zigzag manner with respect to the first wiring 21, it is possible to reduce a load on the first wiring 21 caused by expansion in the vicinity of a plurality of the hole portions 51a to 51c and 52a to 52c of the first substrate 11. Further, a shortest distance between the first hole portion 51a of the first group and the connection member 40 is different from a shortest distance between the first hole portion 52a of the second group and the connection member 40, a shortest distance between the second hole portion 51b of the first group and the connection member 40 is different from a shortest distance between the second hole portion 52b of the second group and the connection member 40, and a shortest distance between the third hole portion 51c of the first group and the connection member 40 is different from a shortest distance between the third hole portion 52c of the second group and the connection member 40. Therefore, it is possible to reduce a load on the first wiring 21 caused by expansion in the vicinity of a plurality of the hole portions 51a to 51c and 52a to 52c of the first substrate 11.

Similarly, regarding the first wiring 21 on the lower side in FIG. 5, the hole portions 52a to 52c of the second group are located on one side (upper side) in the second direction B with respect to the first wiring 21 on the lower side, and the hole portions 53a to 53c of the third group are located on the other side (lower side) in the second direction B with respect to the first wiring 21 on the lower side.

At this time, in the hole portions 52a to 52c of the second group, the first hole portion 52a corresponds to an example of a "first hole portion" described in the claims, the second hole portion 52b corresponds to an example of a "second hole portion" described in the claims, and the third hole portion 52c corresponds to an example of a "third hole portion" described in the claims. Further, in the hole portions 53a to 53c of the third group, the first hole portion 53a corresponds to an example of a "fourth hole portion" described in the claims, and the second hole portion 53b corresponds to an example of a "fifth hole portion" described in the claims.

The hole portions 52a to 52c of the second group and the hole portions 53a to 53c of the third group are alternately arranged along the first direction A. At this time, the center 520a of the first hole portion 52a of the second group and a center 530a of the first hole portion 53a of the third group do not overlap in the second direction B. Further, the center of the second hole portion 52b of the second group and the center of the second hole portion 53b of the third group do not overlap in the second direction B. The center of the third hole portion 52c of the second group and the center of the third hole portion 53c of the third group do not overlap in the second direction B. In other words, the hole portions 52a to 52c of the second group and the hole portions 53a to 53c of the third group are arranged in a zigzag manner with respect to the first wiring 21.

Further, in the first direction A, a shortest distance between the first hole portion 52a of the second group and the connection member 40 (connection region Z1) is different from a shortest distance between the first hole portion 53a of the third group and the connection member 40 (connection region Z1). Further, in the first direction A, a shortest distance between the second hole portion 52b of the second group and the connection member 40 (connection region Z1) is different from a shortest distance between the second hole portion 53b of the third group and the connection member 40 (connection region Z1). Further, in the first direction A, a shortest distance between the third hole portion 52c of the second group and the connection member 40 (connection region Z1) is different from a shortest distance between the third hole portion 53c of the third group and the connection member 40 (connection region Z1).

According to the above configuration, since the hole portions 52a to 52c of the second group and the hole portions 53a to 53c of the third group are included, expansion in the vicinity of a plurality of the hole portions 52a to 52c and 53a to 53c of the first substrate 11 is further improved, and expansion in the vicinity of the connection region Z1 of the first substrate 11 is further reduced, so that disconnection of the first wiring 21 due to expansion of the first substrate 11 can be further prevented. In addition, since the hole portions 52a to 52c of the second group and the hole portions 53a to 53c of the third group are arranged in a zigzag manner with respect to the first wiring 21, it is possible to reduce a load on the first wiring 21 caused by expansion in the vicinity of a plurality of the hole portions 52a to 52c and 53a to 53c of the first substrate 11. Further, a shortest distance between the first hole portion 52a of the second group and the connection member 40 is different from a shortest distance between the first hole portion 53a of the third group and the connection member 40, a shortest distance between the second hole portion 52b of the second group and the connection member 40 is different from a shortest distance between the second hole portion 53b of the third group and the connection member 40, and a shortest distance between the third hole portion 52c of the second group and the connection member 40 is different from a shortest distance between the third hole portion 53c of the third group and the connection member 40. Therefore, it is possible to reduce a load on the first wiring 21 caused by expansion in the vicinity of a plurality of the hole portions 52a to 52c and 53a to 53c of the first substrate 11.

Note that a plurality of hole portions arranged in a zigzag manner may be provided on both sides in the second direction B with respect to any one of the upper and lower first wirings 21.

As illustrated in FIG. 5, the entire first hole portion 51a of the first group and the entire first hole portion 52a of the second group do not overlap in the second direction B. Further, the entire second hole portion 51b of the first group and the entire second hole portion 52b of the second group do not overlap in the second direction B. Further, the entire third hole portion 51c of the first group and the entire third hole portion 52c of the second group do not overlap in the second direction B. According to the above configuration, it is possible to further reduce a load on the first wiring 21 caused by expansion in the vicinity of the hole portions 51a to 51c and 52a to 52c of the first substrate 11.

Similarly, the entire first hole portion 52a of the second group and the entire first hole portion 53a of the third group do not overlap in the second direction B. Further, the entire second hole portion 52b of the second group and the entire second hole portion 53b of the third group do not overlap in the second direction B. Further, the entire third hole portion 52c of the second group and the entire third hole portion 53c of the third group do not overlap in the second direction B. According to the above configuration, it is possible to further reduce a load on the first wiring 21 caused by expansion in the vicinity of the hole portions 52a to 52c and 53a to 53c of the first substrate 11.

Note that a part of the first hole portion 51a of the first group and a part of the first hole portion 52a of the second group may overlap in the second direction B, a part of the second hole portion 51b of the first group and a part of the second hole portion 52b of the second group may overlap in the second direction B, and a part of the third hole portion 51c of the first group and a part of the third hole portion 52c of the second group may overlap in the second direction B. According to the above configuration, expansion in the vicinity of a plurality of the hole portions 51a to 51c and 52a to 52c of the first substrate 11 is further improved, and expansion in the vicinity of the connection region Z1 of the first substrate 11 is further reduced, so that disconnection of the first wiring 21 due to expansion of the first substrate 11 can be further prevented.

Similarly, a part of the first hole portion 52a of the second group and a part of the first hole portion 53a of the third group may overlap in the second direction B, a part of the second hole portion 52b of the second group and a part of the second hole portion 53b of the third group may overlap in the second direction B, and a part of the third hole portion 52c of the second group and a part of the third hole portion 53c of the third group may overlap in the second direction B. According to the above configuration, expansion in the vicinity of a plurality of the hole portions 52a to 52c and 53a to 53c of the first substrate 11 is further improved, and expansion in the vicinity of the connection region Z1 of the first substrate 11 is further reduced, so that disconnection of the first wiring 21 due to expansion of the first substrate 11 can be further prevented.

Note that, in a case where a hole portion is provided in the second substrate 12, it is preferable to have the same configuration as that of the first substrate 11.

Fifth Embodiment

Figure 6:
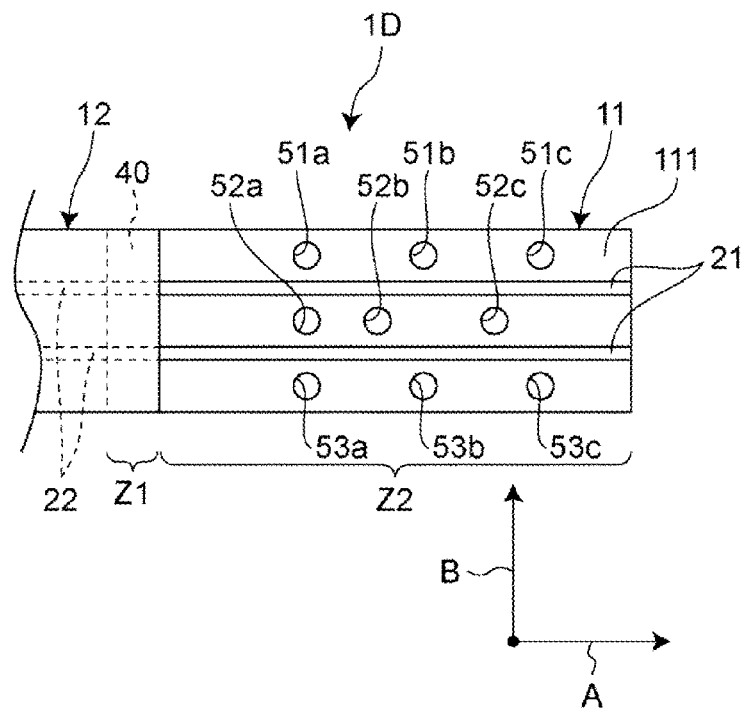
FIG. 6 is a plan view illustrating a fifth embodiment of the stretchable device.

FIG. 6 is a plan view illustrating a fifth embodiment of the stretchable device. The fifth embodiment is different from the fourth embodiment in the configuration of the hole portion. This different configuration will be described below. The other configurations are the same as those of the fourth embodiment, and are denoted by the same reference symbols as those of the fourth embodiment, and will be omitted from description.

As illustrated in FIG. 6, in a stretchable device 1D of the fifth embodiment, at least a part of the hole portion 51a closest to the connection region Z1 among the hole portions 51a to 51c of the first group and at least a part of the hole portion 52a closest to the connection region Z1 among the hole portions 52a to 52c of the second group overlap in the second direction B, and the centers of the other hole portions 51b and 51c among the hole portions 51a to 51c of the first group and the centers of the other hole portions 52b and 52c among the hole portions 52a to 52c of the second group do not overlap in the second direction B.

Specifically, at least a part of the first hole portion 51a of the first group and at least a part of the first hole portion 52a of the second group overlap in the second direction B. Further, the center of the second hole portion 51b of the first group and the center of the second hole portion 52b of the second group do not overlap in the second direction B. Further, the center of the third hole portion 51c of the first group and the center of the third hole portion 52c of the second group do not overlap in the second direction B. In other words, the hole portions 51b and 51c of the first group and the hole portions 52b and 52c of the second group are arranged in a zigzag manner with respect to the first wiring 21.

Further, in the first direction A, a shortest distance between the first hole portion 51a in the first group and the connection member 40 (connection region Z1) is equal to a shortest distance between the first hole portion 52a in the second group and the connection member 40 (connection region Z1). Further, in the first direction A, a shortest distance between the second hole portion 51b of the first group and the connection member 40 (connection region Z1) is different from a shortest distance between the second hole portion 52b of the second group and the connection member 40 (connection region Z1). Further, in the first direction A, a shortest distance between the third hole portion 51c of the first group and the connection member 40 (connection region Z1) is different from a shortest distance between the third hole portion 52c of the second group and the connection member 40 (connection region Z1).

According to the above configuration, since the hole portions 51a to 51c of the first group and the hole portions 52a to 52c of the second group are included, expansion in the vicinity of a plurality of the hole portions 51a to 51c and 52a to 52c of the first substrate 11 is further improved, and expansion in the vicinity of the connection region Z1 of the first substrate 11 is further reduced, so that disconnection of the first wiring 21 due to expansion of the first substrate 11 can be further prevented. Further, since the hole portions 51b and 51c of the first group and the hole portions 52b and 52c of the second group are arranged in a zigzag manner with respect to the first wiring 21, it is possible to reduce a load on the first wiring 21 caused by expansion in the vicinity of a plurality of the hole portions 51b, 51c, 52b, and 52c of the first substrate 11. Further, a shortest distance between the first hole portion 51a of the first group and the connection member 40 is equal to a shortest distance between the first hole portion 52a of the second group and the connection member 40, a shortest distance between the second hole portion 51b of the first group and the connection member 40 is different from a shortest distance between the second hole portion 52b of the second group and the connection member 40, and a shortest distance between the third hole portion 51c of the first group and the connection member 40 is different from a shortest distance between the third hole portion 52c of the second group and the connection member 40. Therefore, it is possible to reduce a load on the first wiring 21 caused by expansion in the vicinity of a plurality of the hole portions 51a to 51c and 52a to 52c of the first substrate 11.

Similarly, at least a part of the hole portion 52a closest to the connection region Z1 among the hole portions 52a to 52c of the second group and at least a part of the hole portion 53a closest to the connection region Z1 among the hole portions 53a to 53c of the third group overlap in the second direction B, and the centers of the other hole portions 52b and 52c among the hole portions 52a to 52c of the second group and the centers of the other hole portions 53b and 53c among the hole portions 53a to 53c of the third group do not overlap in the second direction B.

Specifically, at least a part of the first hole portion 52a of the second group and at least a part of the first hole portion 53a of the third group overlap in the second direction B. Further, the center of the second hole portion 52b of the second group and the center of the second hole portion 53b of the third group do not overlap in the second direction B. The center of the third hole portion 52c of the second group and the center of the third hole portion 53c of the third group do not overlap in the second direction B. In other words, the hole portions 52b and 52c of the second group and the hole portions 53b and 53c of the third group are arranged in a zigzag manner with respect to the first wiring 21.

Further, in the first direction A, a shortest distance between the first hole portion 52a in the second group and the connection member 40 (connection region Z1) is equal to a shortest distance between the first hole portion 53a in the third group and the connection member 40 (connection region Z1). Further, in the first direction A, a shortest distance between the second hole portion 52b of the second group and the connection member 40 (connection region Z1) is different from a shortest distance between the second hole portion 53b of the third group and the connection member 40 (connection region Z1). Further, in the first direction A, a shortest distance between the third hole portion 52c of the second group and the connection member 40 (connection region Z1) is different from a shortest distance between the third hole portion 53c of the third group and the connection member 40 (connection region Z1).

According to the above configuration, since the hole portions 52a to 52c of the second group and the hole portions 53a to 53c of the third group are included, expansion in the vicinity of a plurality of the hole portions 52a to 52c and 53a to 53c of the first substrate 11 is further improved, and expansion in the vicinity of the connection region Z1 of the first substrate 11 is further reduced, so that disconnection of the first wiring 21 due to expansion of the first substrate 11 can be further prevented. Further, since the hole portions 52b and 52c of the second group and the hole portions 53b and 53c of the third group are arranged in a zigzag manner with respect to the first wiring 21, it is possible to reduce a load on the first wiring 21 caused by expansion in the vicinity of a plurality of the hole portions 52b, 52c, 53b, and 53c of the first substrate 11. Further, a shortest distance between the first hole portion 52a of the second group and the connection member 40 is equal to a shortest distance between the first hole portion 53a of the third group and the connection member 40, a shortest distance between the second hole portion 52b of the second group and the connection member 40 is different from a shortest distance between the second hole portion 53b of the third group and the connection member 40, and a shortest distance between the third hole portion 52c of the second group and the connection member 40 is different from a shortest distance between the third hole portion 53c of the third group and the connection member 40. Therefore, it is possible to reduce a load on the first wiring 21 caused by expansion in the vicinity of a plurality of the hole portions 52a to 52c and 53a to 53c of the first substrate 11.

Note that, in a case where a hole portion is provided in the second substrate 12, it is preferable to have the same configuration as that of the first substrate 11.

Sixth Embodiment

Figure 7:
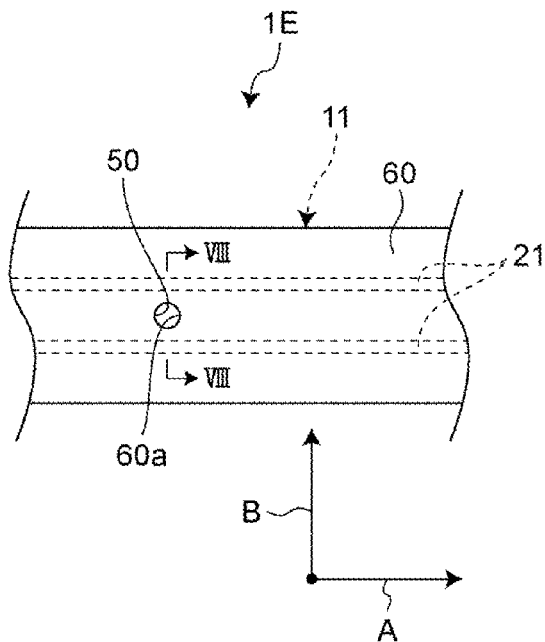
FIG. 7 is a plan view illustrating a sixth embodiment of the stretchable device.
Figure 8:
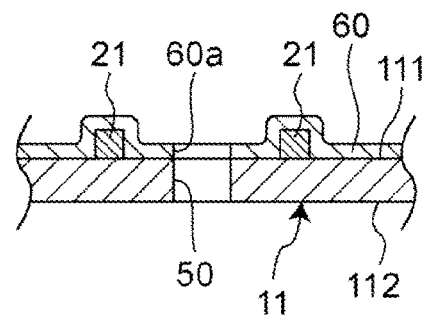
FIG. 8 is a sectional view taken along VIII-VIII of FIG. 7.

FIG. 7 is a plan view illustrating a sixth embodiment of the stretchable device. FIG. 8 is a sectional view taken along VIII-VIII of FIG. 7. The sixth embodiment is different from the first embodiment in that a protective film is provided. This different configuration will be described below. The other configurations are the same as those of the first embodiment, and are denoted by the same reference symbols as those of the first embodiment, and will be omitted from description.

As illustrated in FIGS. 7 and 8, a stretchable device 1E of the sixth embodiment further includes a protective film 60 that covers at least a part of the first main surface 111 of the first substrate 11 and at least a part of the first wiring 21. The protective film 60 has insulating property. The protective film 60 is formed of a resin material, for example, styrene resin, olefin resin, epoxy resin, urethane resin, acrylic resin, or silicone resin.

According to the above configuration, since the protective film 60 covers at least a part of the first wiring 21, insulation from a disturbance factor can be secured, and the first wiring 21 can be prevented from coming into direct contact with skin, and discomfort of the user can be reduced. Further. Since the protective film 60 covers at least a part of the first main surface 111 of the first substrate 11, the first substrate 11 can be prevented from coming into direct contact with skin, and influence of moisture generated from the user can be reduced.

As illustrated in FIGS. 7 and 8, the protective film 60 has a through hole 60a overlapping the hole portion 50 when viewed from a direction orthogonal to the first main surface 111. Preferably, size of the through hole 60a is the same as size of the hole portion 50. According to the above configuration, if the protective film 60 is provided, expansion in the vicinity of the hole portion 50 of the first substrate 11 can be improved, and expansion in the vicinity of the connection region Z1 of the first substrate 11 can be reduced.

Figure 9:
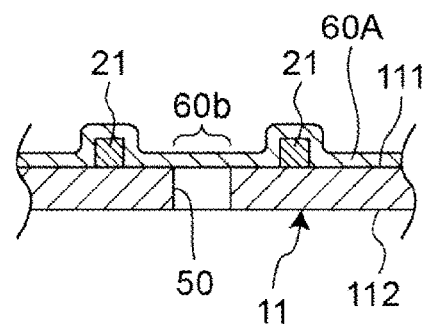
FIG. 9 is a sectional view illustrating another embodiment of a protective film.

FIG. 9 illustrates another mode of the protective film. As illustrated in FIG. 9, a protective film 60A has an overlapping portion 60b overlapping the hole portion 50 when viewed from a direction orthogonal to the first main surface 111. The overlapping portion 60b is located outside the hole portion 50 without entering the inside of the hole portion 50. Preferably, the overlapping portion 60b is located on the same plane as the first main surface 111. According to the above configuration, an internal space of the hole portion 50 can be secured, expansion in the vicinity of the hole portion 50 of the first substrate 11 can be improved, and expansion in the vicinity of the connection region Z1 of the first substrate 11 can be reduced. Note that the overlapping portion 60b does not need to overlap the entire hole portion 50, and only needs to overlap a part of the hole portion 50.

Note that the protective film may be provided on the second main surface 112 of the first substrate 11. The protective film may be provided on the second wiring 22 and the third main surface 121 of the second substrate 12, and may be provided on the fourth main surface 122 of the second substrate 12.

Note that the present disclosure is not limited to the above-described embodiment, and can be changed in design without departing from the gist of the present disclosure. For example, the characteristic features of the first to sixth embodiments may be combined in various ways.

In the above embodiment, the number of the first substrates and the second substrates may be increased, and at this time, a plurality of the first substrates and a plurality of the second substrates may be connected in series. Further, the number of the first wirings and the second wirings may be increased or decreased, and the number of hole portions may be increased or decreased.

In the above embodiment, the first substrate and the second substrate have a rectangular shape, but are not limited to a rectangular shape, and may have, for example, a polygonal shape, an elliptical shape, or an oval shape.

First Example

Figure 10:
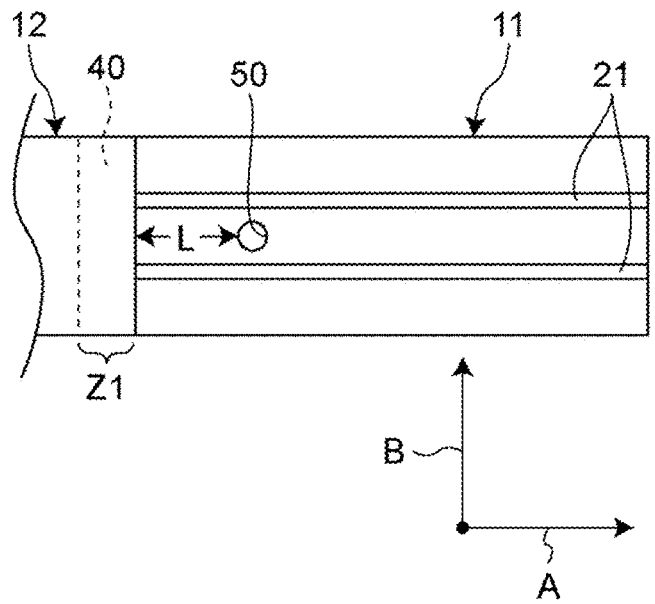
FIG. 10 is a plan view for explaining a first example of the stretchable device.

FIG. 10 is a plan view for explaining a first example of the stretchable device. As illustrated in FIG. 10, two of the first wirings 21 were formed on the first substrate 11. The hole portion 50 having a diameter of 0.5 mm, 1.0 mm, or 1.5 mm was formed in the first substrate 11. The first substrate 11 was elongated twice in the first direction A. At this time, a unit displacement amount in the vicinity of the connection region Z1 of the first substrate 11 was calculated by changing the shortest distance L from the connection region Z1 (connection member 40) to the hole portion 50 between 0.1 mm and 14 mm. As a comparative example, a case where there is no hole portion was calculated.

Figure 11:
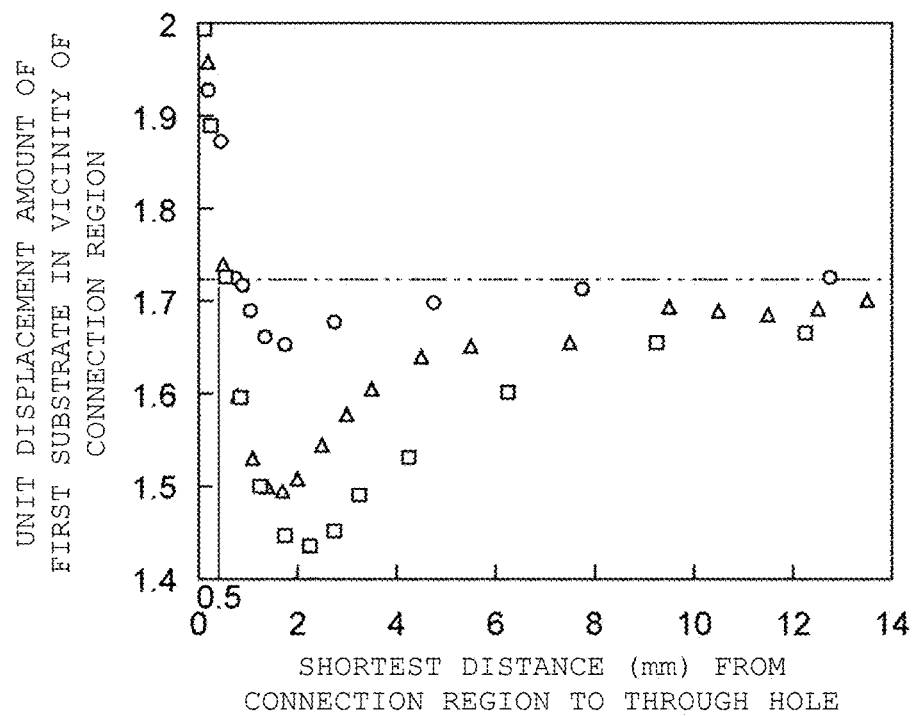
FIG. 11 is a graph illustrating a relationship between a shortest distance from a connection region to a hole portion and a unit displacement amount of a first substrate in the vicinity of a connection region.

A result of this is illustrated in FIG. 11. In FIG. 11, the horizontal axis represents the shortest distance L from the connection region Z1 to the hole portion 50, and the vertical axis represents a unit displacement amount of the first substrate 11 in the vicinity of the connection region Z1. A circle indicates when a diameter of the hole portion 50 is 0.5 mm, a triangle indicates when the diameter of the hole portion 50 is 1.0 mm, and a square indicates when the diameter of the hole portion 50 is 1.5 mm. A two-dot chain line indicates a case where there is no hole portion.

As illustrated in FIG. 11, it can be seen that in a case where the shortest distance L exists in the vicinity (0.5 mm or less) of the connection region Z1, a unit displacement amount of the first substrate 11 in the vicinity of the connection region Z1 becomes large, the first substrate 11 in the vicinity of the connection region Z1 elongates, and the first wiring 21 in the vicinity of the connection region Z1 is likely to be disconnected. That is, it has been confirmed that when the shortest distance L is 0.5 mm or less, the first substrate 11 in the vicinity of the connection region Z1 elongates more than a case where no hole portion is provided.

On the other hand, in a case where the shortest distance L is 0.5 mm to 14 mm, a unit displacement amount of the first substrate 11 in the vicinity of the connection region Z1 is smaller than that in a case where no hole portion is provided, and it can be seen that elongation of the first substrate 11 in the vicinity of the connection region Z1 is reduced. Further, as can be seen from FIG. 11, the shortest distance L is preferably 0.8 mm to 7 mm, more preferably 1 mm to 6.5 mm, still more preferably 1.3 mm to 6 mm, and it can be seen that elongation of the first substrate 11 in the vicinity of the connection region Z1 is further reduced.

Second Example

Figure 12:
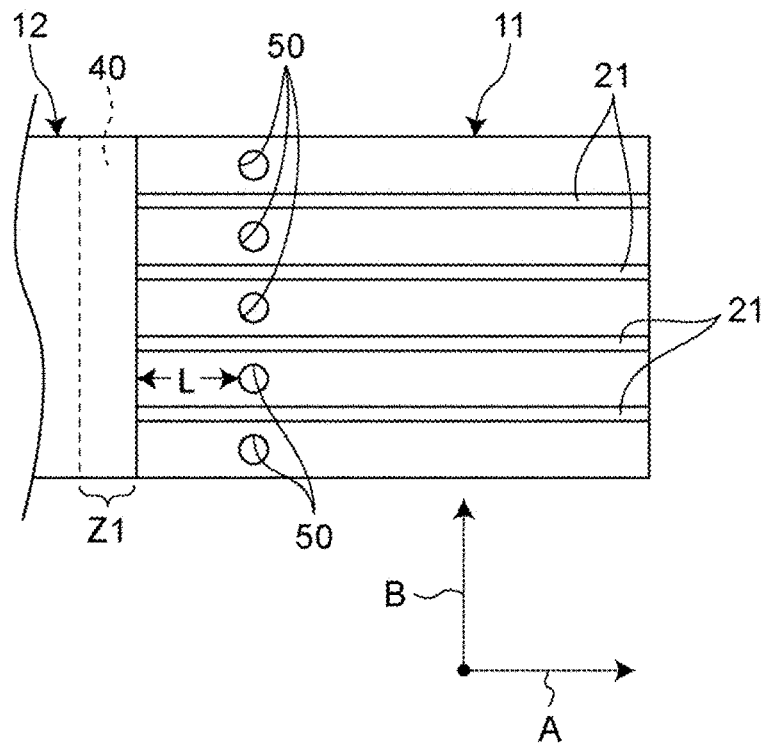
FIG. 12 is a plan view for explaining a second example of the stretchable device.

FIG. 12 is a plan view for explaining a second example of the stretchable device. As illustrated in FIG. 12, four of the first wirings 21 were formed on the first substrate 11. The hole portion 50 having a diameter of 1.0 mm was formed in the first substrate 11. The shortest distance L from the connection region Z1 (connection member 40) to the hole portion 50 was set to 3.0 mm. The first substrate 11 was elongated twice in the first direction A. At this time, a unit displacement amount in the vicinity of the connection region Z1 of the first substrate 11 was calculated by changing the number of the hole portions 50 to one, three, or five. The hole portions 50 were increased in the second direction B. As a comparative example, a case where there is no hole portion was calculated.

Figure 13:
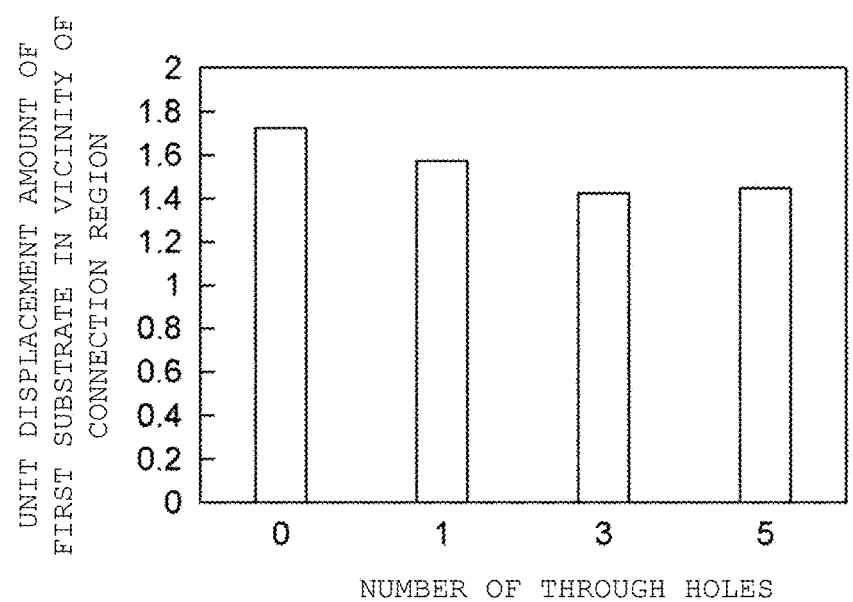
FIG. 13 is a graph illustrating a relationship between the number of hole portions and a unit displacement amount of the first substrate in the vicinity of the connection region.

A result of this is illustrated in FIG. 13. In FIG. 13, the horizontal axis represents the number of the hole portions 50, and the vertical axis represents a unit displacement amount of the first substrate 11 in the vicinity of the connection region Z1. As illustrated in FIG. 13, it has been confirmed that as the number of the hole portions 50 increases, a unit displacement amount of the first substrate 11 in the vicinity of the connection region Z1 decreases, and elongation of the first substrate 11 in the vicinity of the connection region Z1 is reduced.

Third Example

Figure 14:
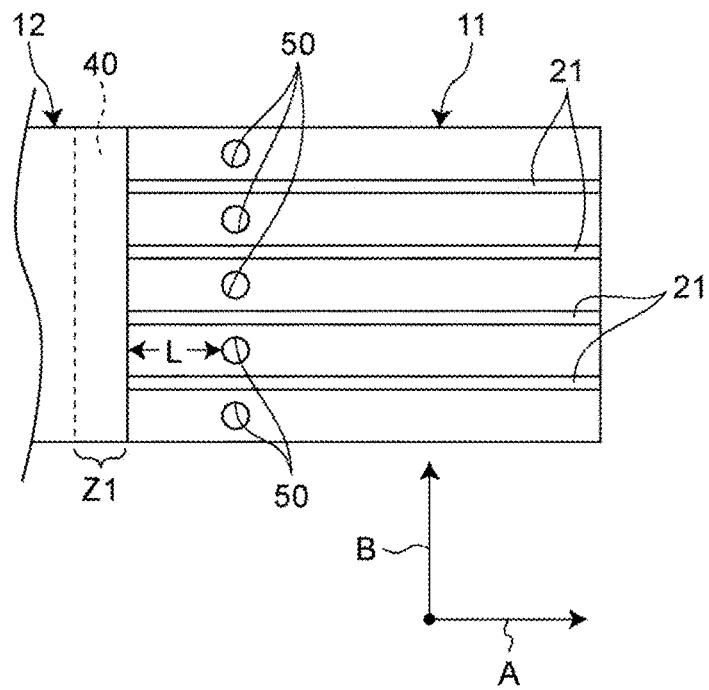
FIG. 14 is a plan view for explaining a third example of the stretchable device.

FIG. 14 is a plan view for explaining a third example of the stretchable device. As illustrated in FIG. 14, four of the first wirings 21 were formed on the first substrate 11. Five of the hole portions 50 having a diameter of 1.0 mm were formed in the first substrate 11. Five of the hole portions 50 were arranged in a line in the second direction B. The first substrate 11 was elongated twice in the first direction A. At this time, a unit displacement amount in the vicinity of the connection region Z1 of the first substrate 11 was calculated by changing the shortest distance L from the connection region Z1 (connection member 40) to the hole portion 50 to 1.5 mm, 3.0 mm, and 4.5 mm. As a comparative example, a case where there is no hole portion was calculated.

Figure 15:
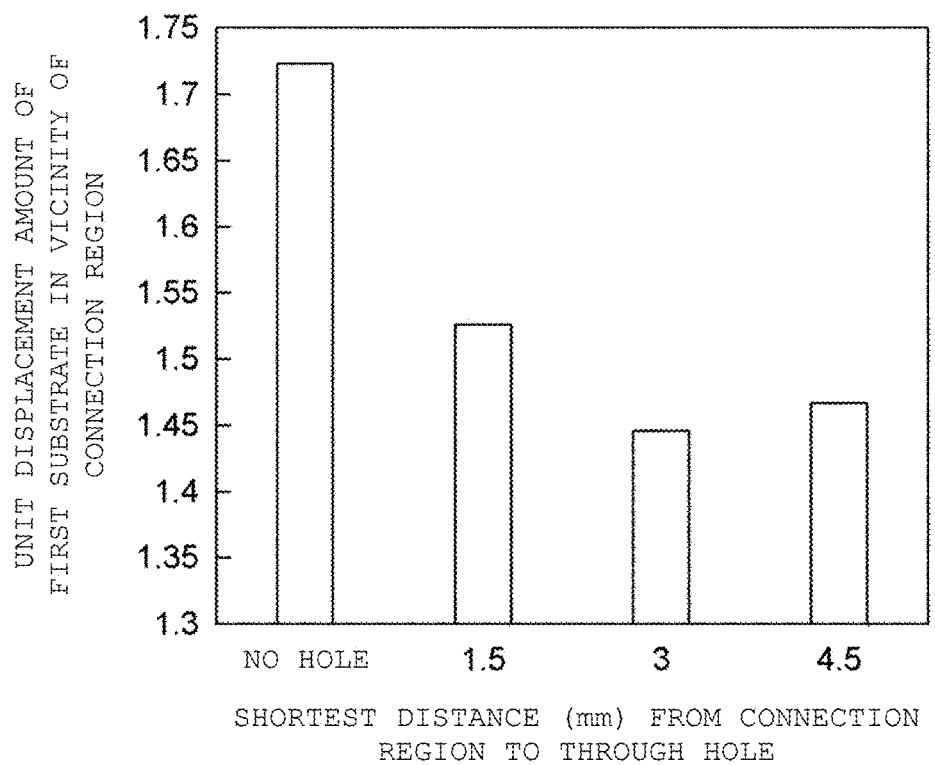
FIG. 15 is a graph illustrating a relationship between a shortest distance from the connection region to the hole portion and a unit displacement amount of the first substrate in the vicinity of the connection region.

A result of this is illustrated in FIG. 15. In FIG. 15, the horizontal axis represents a shortest distance from the connection region Z1 to the hole portion 50, and the vertical axis represents a unit displacement amount of the first substrate 11 in the vicinity of the connection region Z1. As illustrated in FIG. 15, it has been confirmed that by arranging the hole portions 50 in a line, a unit displacement amount of the first substrate 11 in the vicinity of the connection region Z1 is small, and elongation of the first substrate 11 in the vicinity of the connection region Z1 is reduced. In particular, it has been confirmed that elongation of the first substrate 11 in the vicinity of the connection region Z1 is most reduced as the shortest distance L is set to 3.0 mm.

Fourth Example

Figure 16:
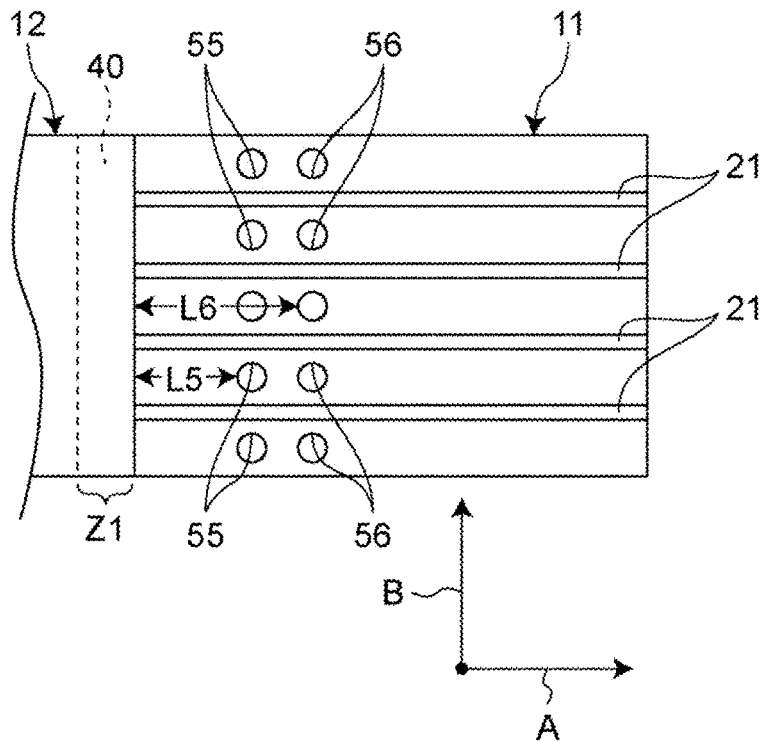
FIG. 16 is a plan view for explaining a fourth example of the stretchable device.

FIG. 16 is a plan view for explaining a fourth example of the stretchable device. As illustrated in FIG. 16, four of the first wirings 21 were formed on the first substrate 11. Hole portions 55 and 56 having a diameter of 1.0 mm were formed in the first substrate 11. Five of the hole portions 55 and 56 were arranged in the second direction B to form a set, and two of the sets were arranged in the first direction A. That is, five of the hole portions 55 in a first row and five of the hole portions 56 in a second row were formed in order from a position close to the connection region Z1. A shortest distance L5 from the connection region Z1 (connection member 40) to five of the hole portions 55 in the first row was set to 3.0 mm. The first substrate 11 was elongated twice in the first direction A. At this time, a unit displacement amount in the vicinity of the connection region Z1 of the first substrate 11 was calculated by changing a shortest distance L6 from the connection region Z1 (connection member 40) to five of the hole portions 56 in the second row to 4.1 mm, 4.5 mm, and 5.5 mm.

Figure 17:
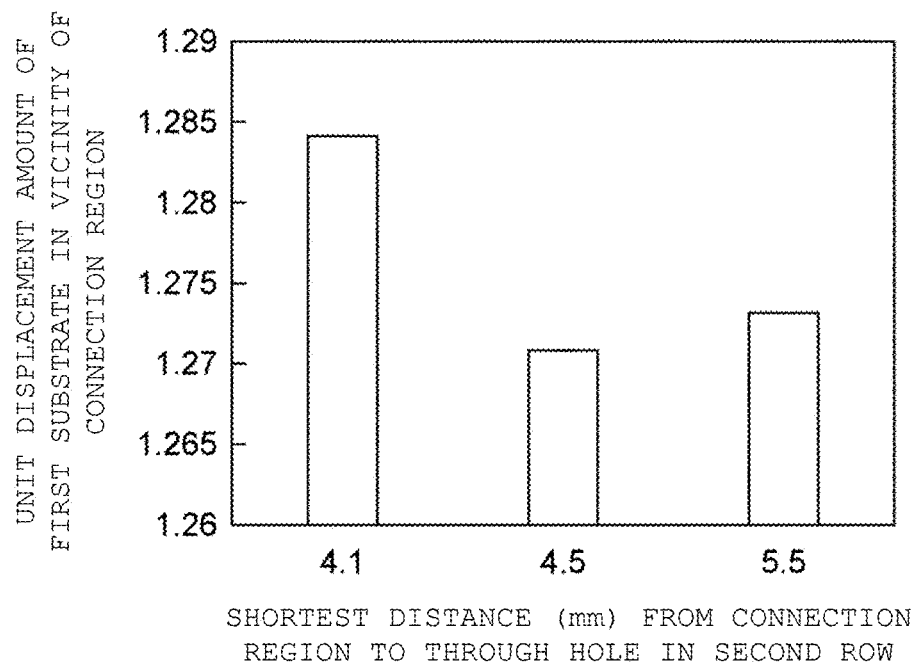
FIG. 17 is a graph illustrating a relationship between a shortest distance from the connection region to the hole portion in a second row and a unit displacement amount of the first substrate in the vicinity of the connection region.

A result of this is illustrated in FIG. 17. In FIG. 17, the horizontal axis represents a shortest distance from the connection region Z1 to five of the hole portions 56 in the second row, and the vertical axis represents a unit displacement amount of the first substrate 11 in the vicinity of the connection region Z1. As illustrated in FIG. 17, it has been confirmed that by providing five of the hole portions 56 in the second row, a unit displacement amount of the first substrate 11 in the vicinity of the connection region Z1 is small as compared with FIG. 15 and elongation of the first substrate 11 in the vicinity of the connection region Z1 is reduced. In particular, it has been confirmed that elongation of the first substrate 11 in the vicinity of the connection region Z1 is most reduced by setting a shortest distance to five of the hole portions 56 in the second row to 4.5 mm.

Fifth Example

Figure 18:
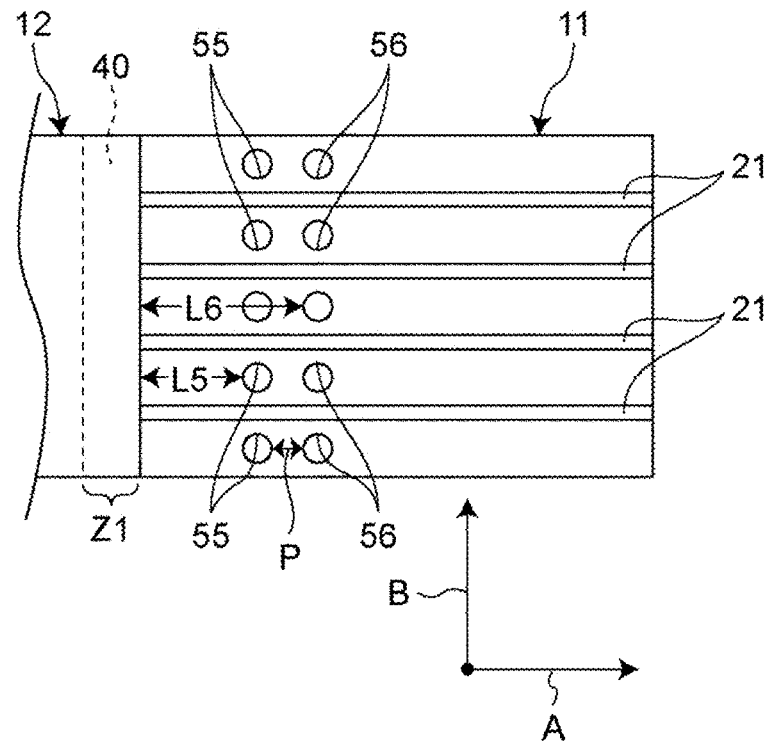
FIG. 18 is a plan view for explaining a fifth example of the stretchable device.

FIG. 18 is a plan view for explaining a fifth example of the stretchable device. As illustrated in FIG. 18, four of the first wirings 21 were formed on the first substrate 11. Hole portions 55 and 56 having a diameter of 1.0 mm were formed in the first substrate 11. Five of the hole portions 55 and 56 were arranged in the second direction B to form a set, and for example, a plurality of the sets were arranged in the first direction A. Specifically, five of the hole portions 55 in a first row and five of the hole portions 56 in a second row were formed in order from a position close to the connection region Z1. A shortest distance L5 from the connection region Z1 (connection member 40) to five of the hole portions 55 in the first row was set to 3.0 mm. The first substrate 11 was elongated twice in the first direction A.

At this time, from the hole portions 55 in the first row, the hole portions 56 in the second row, hole portions in a third row, hole portions in a fourth row, and hole portions in a fifth row were increased in order, and a unit displacement amount in the vicinity of the connection region Z1 of the first substrate 11 was calculated. The shortest distance L6 from the connection region Z1 to five of the hole portions 56 in the second row was set to 4.5 mm, a shortest distance from the connection region Z1 to five of the hole portions in the third row was set to 6.0 mm, a shortest distance from the connection region Z1 to five of the hole portions in the fourth row was set to 7.5 mm, and a shortest distance from the connection region 21 to five of the hole portions in the fifth row was set to 9.5 mm. That is, an interval P between hole portions adjacent to each other in the first direction A was set to 0.5 mm.

Figure 19:
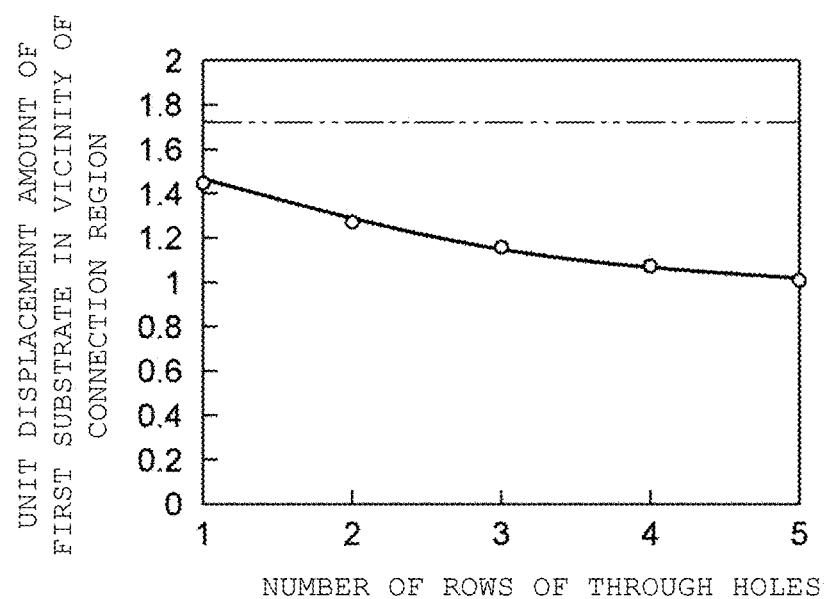
FIG. 19 is a graph illustrating a relationship between the number of rows of the hole portions and a unit displacement amount of the first substrate in the vicinity of the connection region.

A result of this is illustrated in FIG. 19. In FIG. 19, the horizontal axis represents the number of rows of the hole portions, and the vertical axis represents a unit displacement amount of the first substrate 11 in the vicinity of the connection region Z1. A two-dot chain line indicates a case where there is no hole portion. As illustrated in FIG. 19, it has been confirmed that as the number of rows of the hole portions increases, a unit displacement amount of the first substrate 11 in the vicinity of the connection region Z1 decreases, and elongation of the first substrate 11 in the vicinity of the connection region Z1 is reduced. In particular, it can be seen that contribution of the hole portions in the first, second, and third rows is large in reduction of elongation of the first substrate 11 in the vicinity of the connection region Z1.

Sixth Example

In the third example and the fifth example, an expansion amount of the stretchable device when the wiring (the first wiring or the second wiring) is disconnected in the vicinity of the connection region was measured.

Specifically, in the third example, four silver-containing wirings were printed on each of the first substrate and the second substrate with a dispenser. A wiring width was set to 0.5 mm, a wiring length was set to 15 mm, and a wiring interval was set to 1 mm. The first substrate and the second substrate were joined by a connection member (ACF). Five hole portions having a diameter of 0.7 mm were formed in each of the first substrate and the second substrate by laser processing. The five hole portions were arranged in a line in a direction orthogonal to the first direction. A shortest distance from the connection region (connection member) to the hole portion was set to 3.0 mm. Then, an end portion of each of the first substrate and the second substrate was gripped, and the first substrate and the second substrate were expanded by 1 mm in the first direction until the wiring was disconnected. As a result, disconnection was confirmed at a time point at which the first substrate and the second substrate were elongated by 22 mm.

In the fifth example, four silver-containing wirings were printed on each of the first substrate and the second substrate with a dispenser. A wiring width was set to 0.5 mm, a wiring length was set to 15 mm, and a wiring interval was set to 1 mm. The first substrate and the second substrate were joined by a connection member (ACF). A hole portion having a diameter of 0.7 mm was formed in each of the first substrate and the second substrate by laser processing. Four rows of five of the hole portions were formed. A shortest distance between the hole portion in a first row from the connection region was set to 3.0 mm, a shortest distance between the hole portion in a second row from the connection region was set to 4.5 mm, a shortest distance between the hole portion in a third row from the connection region was set to 5.5 mm, and a shortest distance between the hole portion in a fourth row from the connection region was set to 6.7 mm. Then, an end portion of each of the first substrate and the second substrate was gripped, and the first substrate and the second substrate were expanded by 1 mm in the first direction until the wiring was disconnected. As a result, disconnection was confirmed at a time point at which the first substrate and the second substrate were elongated by 24 mm.

As a first comparative example, four silver-containing wirings were printed on each of the first substrate and the second substrate with a dispenser. A wiring width was set to 0.5 mm, a wiring length was set to 15 mm, and a wiring interval was set to 0.5 mm. The first substrate and the second substrate were joined by a connection member (ACF). Then, an end portion of each of the first substrate and the second substrate was gripped, and the first substrate and the second substrate were expanded by 1 mm in the first direction until the wiring was disconnected. As a result, disconnection was confirmed at a time point at which the first substrate and the second substrate were elongated by 18 mm.

As a second comparative example, four silver-containing wirings were printed on each of the first substrate and the second substrate with a dispenser. A wiring width was set to 0.5 mm, a wiring length was set to 15 mm, and a wiring interval was set to 1 mm. The first substrate and the second substrate were joined by a connection member (ACF). Five hole portions having a diameter of 0.7 mm were formed in each of the first substrate and the second substrate by laser processing. The five hole portions were arranged in a line in a direction orthogonal to the first direction. A shortest distance from the connection region (connection member) to the hole portion was set to 0.2 mm. Then, an end portion of each of the first substrate and the second substrate was gripped, and the first substrate and the second substrate were expanded by 1 mm in the first direction until the wiring was disconnected. As a result, disconnection was confirmed at a time point at which the first substrate and the second substrate were elongated by 16 mm.

Figure 20:
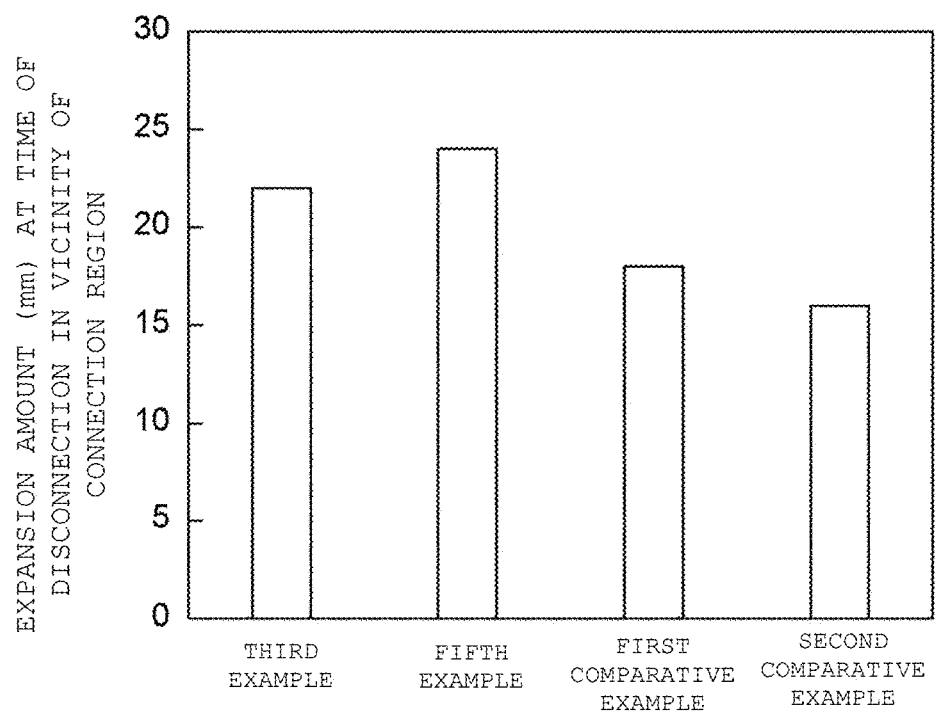
FIG. 20 is a graph explaining a sixth example of the stretchable device and illustrating an expansion amount of the stretchable device when a wiring is disconnected in the vicinity of the connection region.

A result of this is illustrated in FIG. 20. FIG. 20 illustrates an expansion amount of the stretchable device when the wiring is disconnected in the vicinity of the connection region in each of the third example, the fifth example, the first comparative example, and the second comparative example. As is clear from FIG. 20, in the third example and the fifth example, as compared with the first comparative example and the second comparative example, an expansion amount of the stretchable device is large, and disconnection of the wiring is less likely to occur in the vicinity of the connection region.

Note that, in the above description, the hole portion 50 corresponding to the first hole portion according to the claims is closest to the connection member among a plurality of the hole portions including the other hole portions arranged in the first direction with respect to the first hole portion on the first main surface. However, the present invention is not limited to such a structure, and different one of the hole portions 50 may be arranged between the hole portion 50 corresponding to the first hole portion and the connection member.

DESCRIPTION OF REFERENCE SYMBOLS

1, 1A to 1E: Stretchable device
11: First substrate
111: First main surface
112: Second main surface
12: Second substrate
121: Third main surface
122: Fourth main surface
21: First wiring
22: Second wiring
40: Connection member
50: Hole portion
50*a*, 51*a*, 52*a*, 53*a*: First hole portion
50*b*, 51*b*, 52*b*, 53*b*: Second hole portion
50*c*, 51*c*, 52*c*, 53*c*: Third hole portion
510*a*, 520*a*, 530*a*: Center
55: Hole portion in first row
56: Hole portion in second row
60, 60A: Protective film
60*a*: Through hole
60*b*: Overlapping portion
A: First direction
B: Second direction
L: Shortest distance
L1: First shortest distance
L2: Second shortest distance
L3: Third shortest distance
L5: Shortest distance of hole portion in first row
L6: Shortest distance of hole portion in second row
P: Interval of hole portions
Z1: Connection region
Z2: Non-connection region

The invention claimed is:

1. A stretchable device comprising: a stretchable first substrate that has a first main surface and a second main surface facing each other, the stretchable first substrate extending in a first direction; a stretchable first wiring on the first main surface and extending along the first main surface; a second substrate that has a third main surface and a fourth main surface facing each other; and a second wiring on the third main surface and extending along the third main surface, wherein the stretchable first substrate includes a connection region overlapping the second substrate and a non-connection region not overlapping the second substrate when viewed from a direction orthogonal to the first main surface, the stretchable first substrate and the second substrate are connected in the connection region, and the stretchable first substrate has a first hole portion in at least one of the first main surface and the second main surface in the non-connection region, wherein a shortest distance in the first direction between the first hole portion and the connection region is larger than a maximum diameter in the first direction of the first hole portion.

2. The stretchable device according to claim 1, wherein the first hole portion penetrates the stretchable first substrate.

3. The stretchable device according to claim 1, wherein a part of the stretchable first substrate is present between the first wiring and the first hole portion in a second direction orthogonal to the stretchable first direction.

4. The stretchable device according to claim 1, further comprising:
a second hole portion arranged in the first direction with respect to the first hole portion, wherein
the first hole portion is closer to the connection region than the second hole portion, and
a shortest distance between the connection region and the first hole portion is larger than a shortest distance between the first hole portion and the second hole portion in the first direction.

5. The stretchable device according to claim 4, further comprising:
a third hole portion arranged in the first direction with respect to the first hole portion and the second hole portion, wherein
the second hole portion is closer to the connection region than the third hole portion, and
a shortest distance between the first hole portion and the second hole portion is larger than a shortest distance between the second hole portion and the third hole portion in the first direction.

6. The stretchable device according to claim 1, further comprising:
a fourth hole portion, wherein
the first wiring is arranged between the first hole portion and the fourth hole portion.

7. The stretchable device according to claim 6, further comprising:
a fifth hole portion arranged in the first direction with respect to the fourth hole portion, wherein
the fourth hole portion is closer to the connection region than the fifth hole portion in the first direction.

8. The stretchable device according to claim 7, further comprising:
a second hole portion arranged in the first direction with respect to the first hole portion, wherein
the first hole portion is closer to the connection region than the second hole portion in the first direction,
a shortest distance between the first hole portion and the connection region is different from a shortest distance between the fourth hole portion and the connection region in the first direction, and
a shortest distance between the second hole portion and the connection region is different from a shortest distance between the fifth hole portion and the connection region in the first direction.

9. The stretchable device according to claim 8, wherein the second hole portion and the fifth hole portion are arranged in a zigzag manner.

10. The stretchable device according to claim 7, further comprising:

a second hole portion arranged in the first direction with respect to the first hole portion, wherein
the first hole portion is closer to the connection region than the second hole portion in the first direction,
a shortest distance between the first hole portion and the connection region is equal to a shortest distance between the fourth hole portion and the connection region in the first direction, and
a shortest distance between the second hole portion and the connection region is different from a shortest distance between the fifth hole portion and the connection region in the first direction.

11. The stretchable device according to claim 10, wherein the second hole portion and the fifth hole portion are arranged in a zigzag manner.

12. The stretchable device according to claim 1, further comprising a protective film covering at least a part of the first main surface of the stretchable first substrate and at least a part of the stretchable first wiring.

13. The stretchable device according to claim 12, wherein the protective film has a through hole overlapping the hole portion when viewed from the direction orthogonal to the first main surface.

14. The stretchable device according to claim 13, wherein
the protective film has an overlapping portion overlapping the hole portion as viewed from the direction orthogonal to the first main surface, and
the overlapping portion is located outside the hole portion.

15. The stretchable device according to claim 1, further comprising:
a connection member that connects the stretchable first substrate and the second substrate in the connection region, and the connection member overlaps the connection region when viewed from the direction orthogonal to the first main surface.

16. The stretchable device according to claim 15, wherein a shortest distance in the first direction between the first hole portion and the connection region is larger than a maximum diameter in the first direction of the first hole portion.

17. The stretchable device according to claim 15, wherein a part of the stretchable first substrate is present between the first wiring and the first hole portion in a second direction orthogonal to the stretchable first direction.

18. The stretchable device according to claim 15, further comprising:
a second hole portion arranged in the first direction with respect to the first hole portion, wherein
the first hole portion is closer to the connection region than the second hole portion, and
a shortest distance between the connection region and the first hole portion is larger than a shortest distance between the first hole portion and the second hole portion in the first direction.

19. The stretchable device according to claim 18, further comprising:
a third hole portion arranged in the first direction with respect to the first hole portion and the second hole portion, wherein
the second hole portion is closer to the connection region than the third hole portion, and
a shortest distance between the first hole portion and the second hole portion is larger than a shortest distance between the second hole portion and the third hole portion in the first direction.

* * * * *